United States Patent
Rafac et al.

(10) Patent No.: US 9,232,624 B2
(45) Date of Patent: Jan. 5, 2016

(54) TARGET FOR LASER PRODUCED PLASMA EXTREME ULTRAVIOLET LIGHT SOURCE

(71) Applicant: ASML Netherlands B.V., Velhoven (NL)

(72) Inventors: Robert J. Rafac, Encinitas, CA (US); Yezheng Tao, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/817,408

(22) Filed: Aug. 4, 2015

(65) Prior Publication Data

US 2015/0342016 A1    Nov. 26, 2015

Related U.S. Application Data

(63) Continuation of application No. 14/563,186, filed on Dec. 8, 2014, now Pat. No. 9,107,279, which is a continuation of application No. 14/152,881, filed on Jan. 10, 2014, now Pat. No. 8,927,952, which is a continuation of application No. 13/830,461, filed on Mar. 14, 2013, now Pat. No. 8,872,143.

(51) Int. Cl.
   *H05G 2/00*    (2006.01)
   *G03F 7/20*    (2006.01)

(52) U.S. Cl.
   CPC .......... *H05G 2/008* (2013.01); *G03F 7/70033* (2013.01); *H05G 2/005* (2013.01)

(58) Field of Classification Search
   CPC ......... H05G 2/00; H05G 2/001; H05G 2/003; H05G 2/005; H05G 2/008
   USPC .................................. 250/504 R; 378/143
   See application file for complete search history.

(56) References Cited

U.S. PATENT DOCUMENTS

| 6,973,164 B2 | 12/2005 | Hartlove |
| 7,239,686 B2 | 7/2007 | Berglund |
| 7,491,954 B2 | 2/2009 | Bykanov |

(Continued)

FOREIGN PATENT DOCUMENTS

| WO | 2011102277 | 8/2011 |
| WO | 2011122397 | 10/2011 |

OTHER PUBLICATIONS

Fujimoto et al., "Development of Laser-Produced Tin Plasma-Based EUV Light Source Technology for HVM EUV Lithography", Physics Research International, vol. 2012, Article ID—249495, 2012, 11 pages.

(Continued)

*Primary Examiner* — Michael Maskell
(74) *Attorney, Agent, or Firm* — DiBerardino McGovern IP Group LLC

(57) ABSTRACT

Techniques for generating EUV light include directing a first pulse of radiation toward a target material droplet to form a modified droplet, the first pulse of radiation having an energy sufficient to alter a shape of the target material droplet; directing a second pulse of radiation toward the modified droplet to form an absorption material, the second pulse of radiation having an energy sufficient to change a property of the modified droplet, the property being related to absorption of radiation; and directing an amplified light beam toward the absorption material, the amplified light beam having an energy sufficient to convert at least a portion of the absorption material into extreme ultraviolet (EUV) light.

20 Claims, 15 Drawing Sheets

(56) References Cited

U.S. PATENT DOCUMENTS

| | | | |
|---|---|---|---|
| 7,608,846 | B2 | 10/2009 | Nakano |
| 7,916,388 | B2 | 3/2011 | Bykanov |
| 7,923,705 | B2 | 4/2011 | Moriya |
| 7,999,241 | B2 | 8/2011 | Nagai |
| 8,242,472 | B2 | 8/2012 | Moriya |
| 8,324,600 | B2 | 12/2012 | Hayashi |
| 8,436,328 | B2 * | 5/2013 | Yanagida ............ G03F 7/70033 250/396 ML |
| 8,872,143 | B2 | 10/2014 | Rafac |
| 8,927,952 | B2 | 1/2015 | Rafac |
| 2006/0255298 | A1 | 11/2006 | Bykanov |
| 2010/0051831 | A1 | 3/2010 | Tao |
| 2010/0181503 | A1 | 7/2010 | Yanagida |
| 2010/0193710 | A1 | 8/2010 | Wakabayashi |
| 2011/0057126 | A1 | 3/2011 | Hoshino |
| 2011/0317256 | A1 | 12/2011 | Hou |
| 2012/0092746 | A1 | 4/2012 | Hou |
| 2012/0228525 | A1 | 9/2012 | Moriya |
| 2012/0235066 | A1 | 9/2012 | Ershov |
| 2012/0243566 | A1 | 9/2012 | Hori |
| 2012/0248344 | A1 | 10/2012 | Wakabayashi |
| 2012/0305811 | A1 | 12/2012 | Wakabayashi |
| 2012/0307851 | A1 | 12/2012 | Hori |
| 2012/0313016 | A1 | 12/2012 | Fleurov |
| 2012/0319014 | A1 | 12/2012 | Moriya |
| 2013/0146682 | A1 | 6/2013 | Ishihara |
| 2014/0183379 | A1 | 7/2014 | Hori |
| 2014/0264090 | A1 | 9/2014 | Rafac |

OTHER PUBLICATIONS

Garban-Labaune et al., "Resonance Absorption in CO2 Laser-Plane Targets Interaction Experiments", Journal De Physique-Lettres, vol. 41, No. 19, Oct. 1980, pp. 463-467.

Larsen, Jon T., "Absorption and Profile Modification on Spherical Targets for. $.25<\lambda<2$ Microns", Lawrence Livermore Laboratory, Presentation at the 8th Annual Conference on Anomalous Absorption of Electromagnetic Waves, Tucson, Arizona, Apr. 4, 1978, 48 pages.

Nakano et al., "Sn Droplet Target Development for Laser Produced Plasma EUV Light Source", Emerging Lithographic Technologies XII., Edited by Schellenberg, Frank M., Proceedings of the SPIE, vol. 6921, Article ID. 692130, 2008, 8 pages.

International Search Report and Written Opinion of the International Searching Authority for International Application No. PCT/US14/16967, mailed Mar. 19, 2014, 6 pages.

Non-Final Office Action in U.S. Appl. No. 13/830,461, mailed Feb. 26, 2014.

Non-Final Office Action in U.S. Appl. No. 14/152,881, mailed Feb. 11, 2014, 17 pages.

Final Office Action in U.S. Appl. No. 14/152,881, mailed May 22, 2014, 20 pages.

* cited by examiner

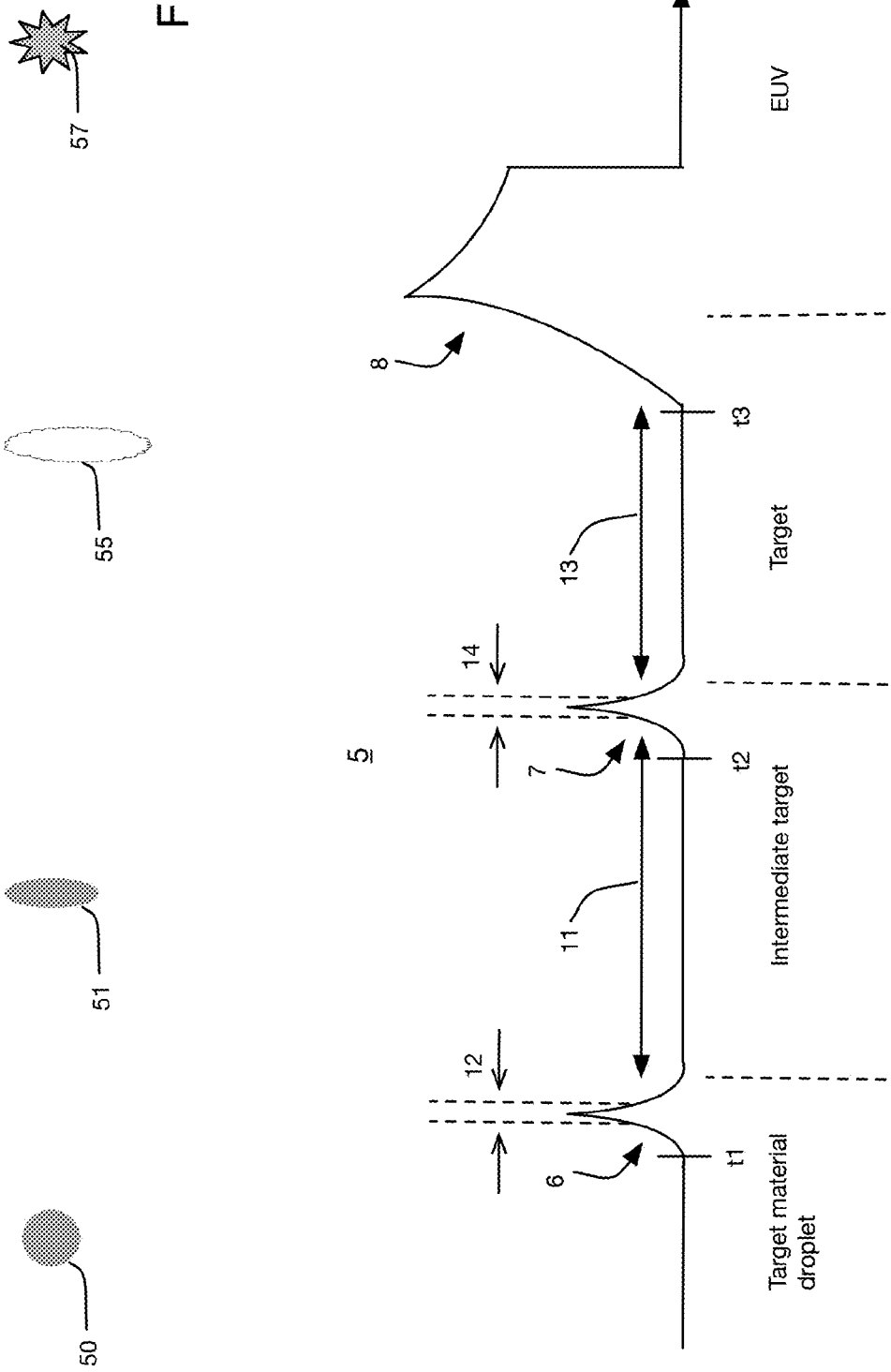

400

---

Direct a first pulse of radiation toward a target material droplet to form an altered droplet, the first pulse of radiation having an energy sufficient to alter a shape of the target material droplet — 410

Direct a second pulse of radiation toward the altered droplet to form an absorption material, the second pulse of radiation having an energy sufficient to change a property of the altered droplet, the property being related to absorption of radiation — 420

Direct an amplified light beam toward the absorption material, the amplified light beam being sufficient to convert at least a portion of the absorption material into extreme ultraviolet (EUV) radiation — 430

FIG. 4

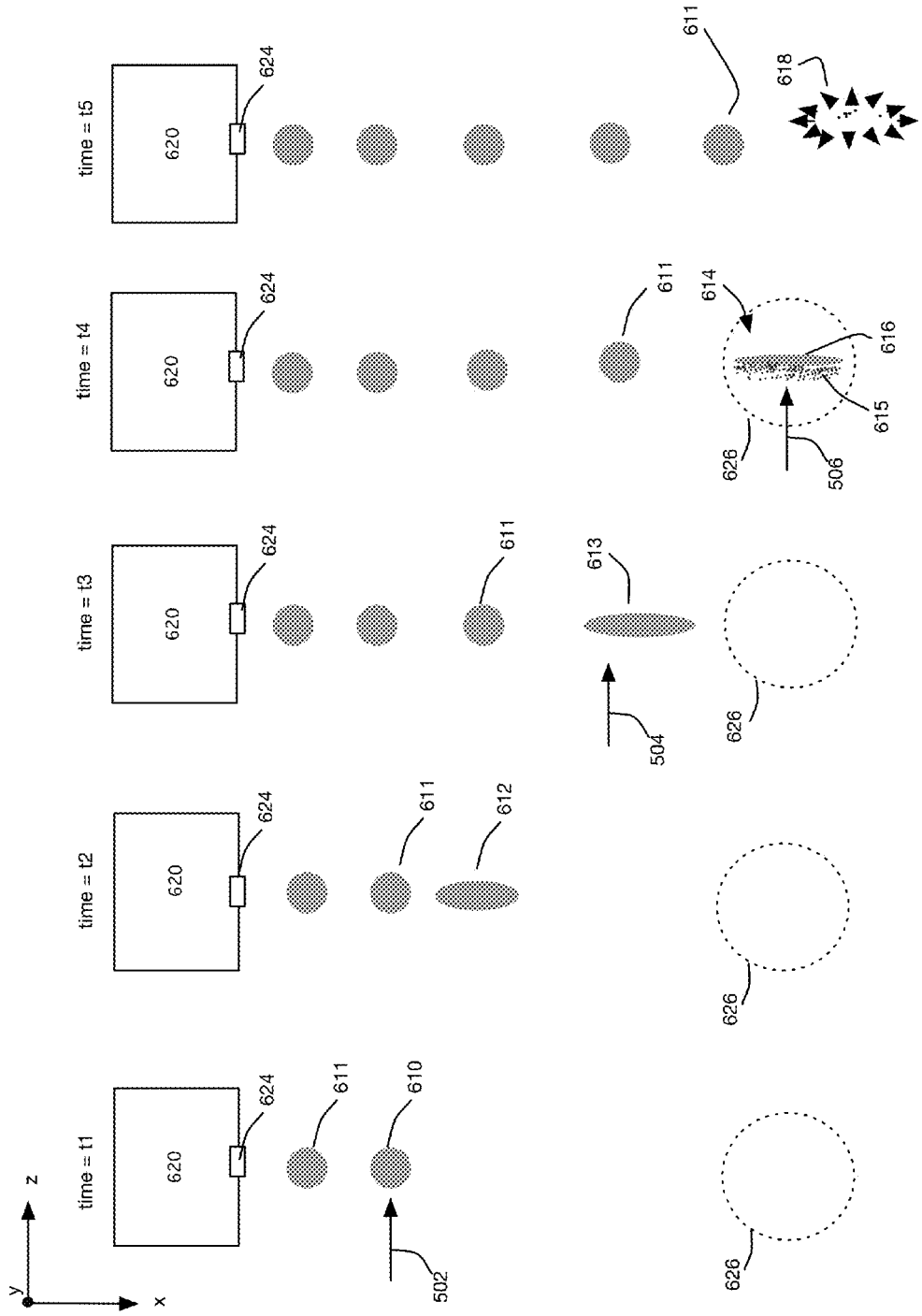

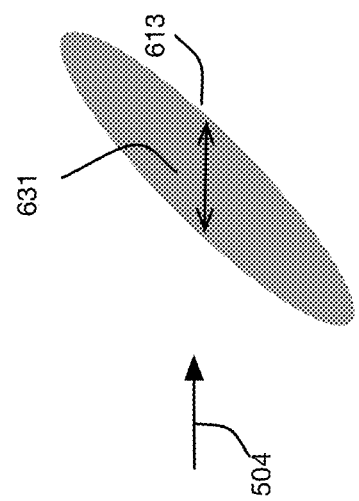
FIG. 6G
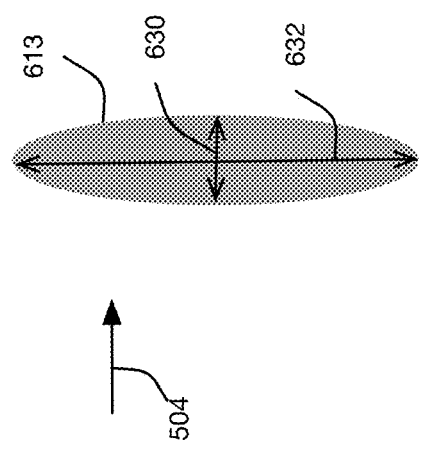
FIG. 6F
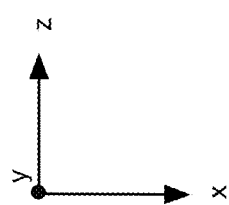

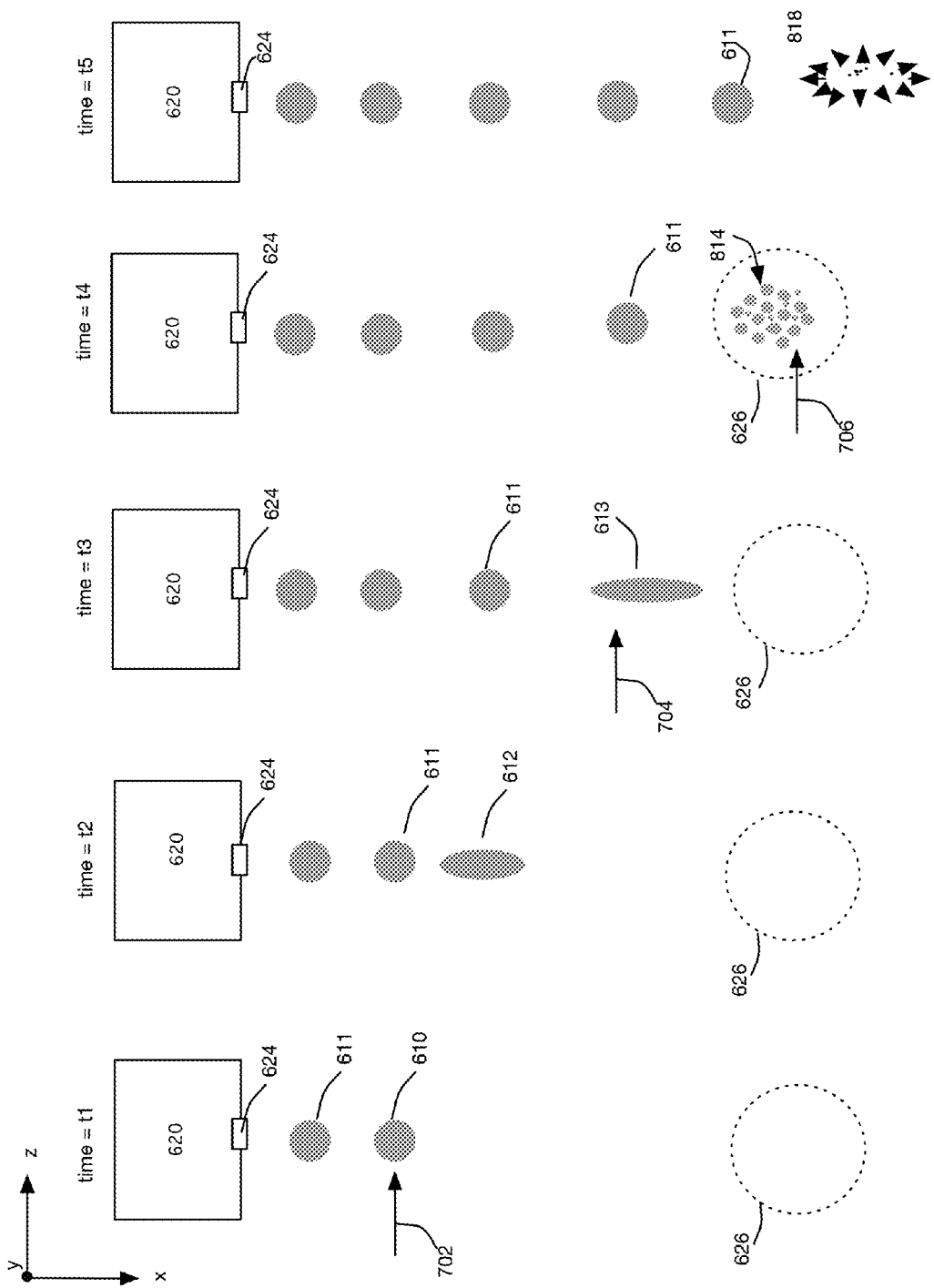

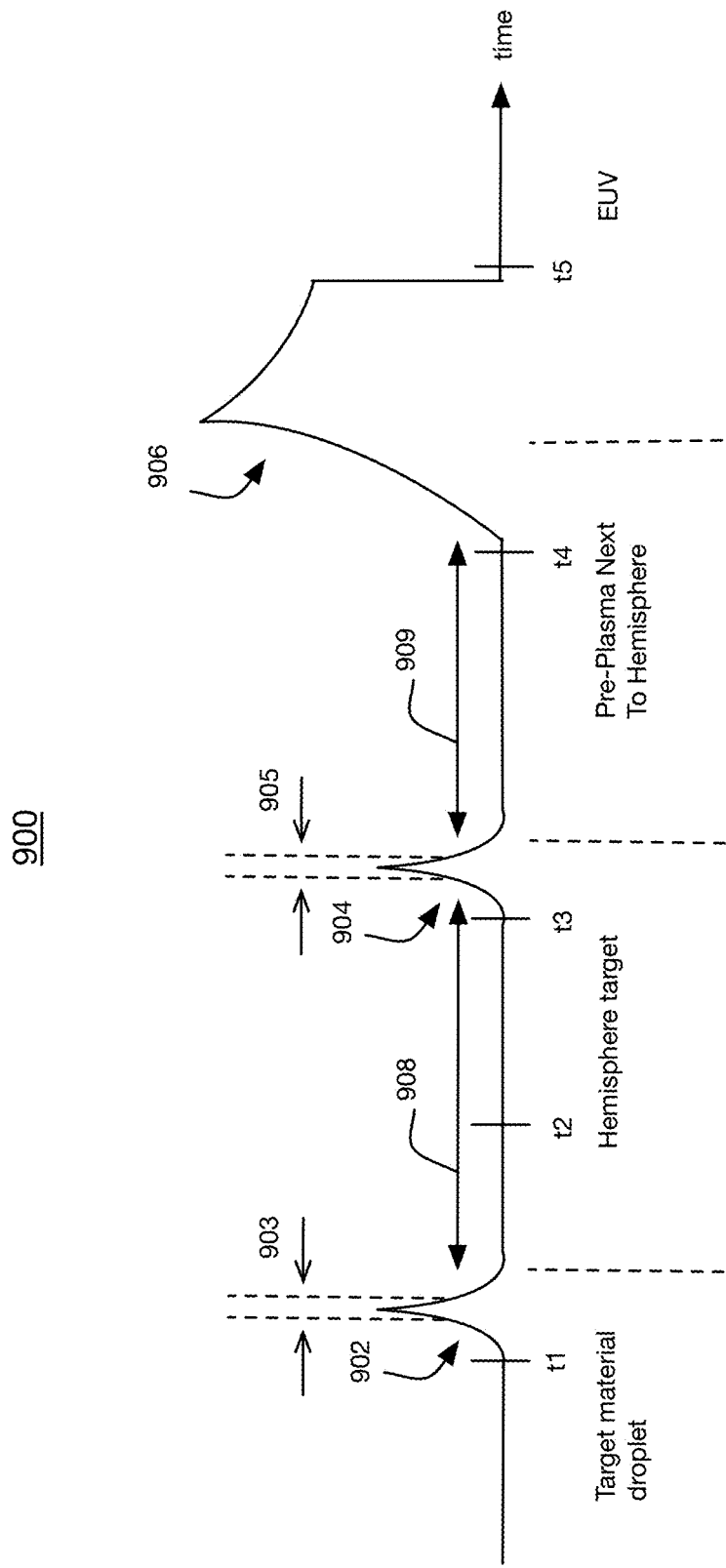

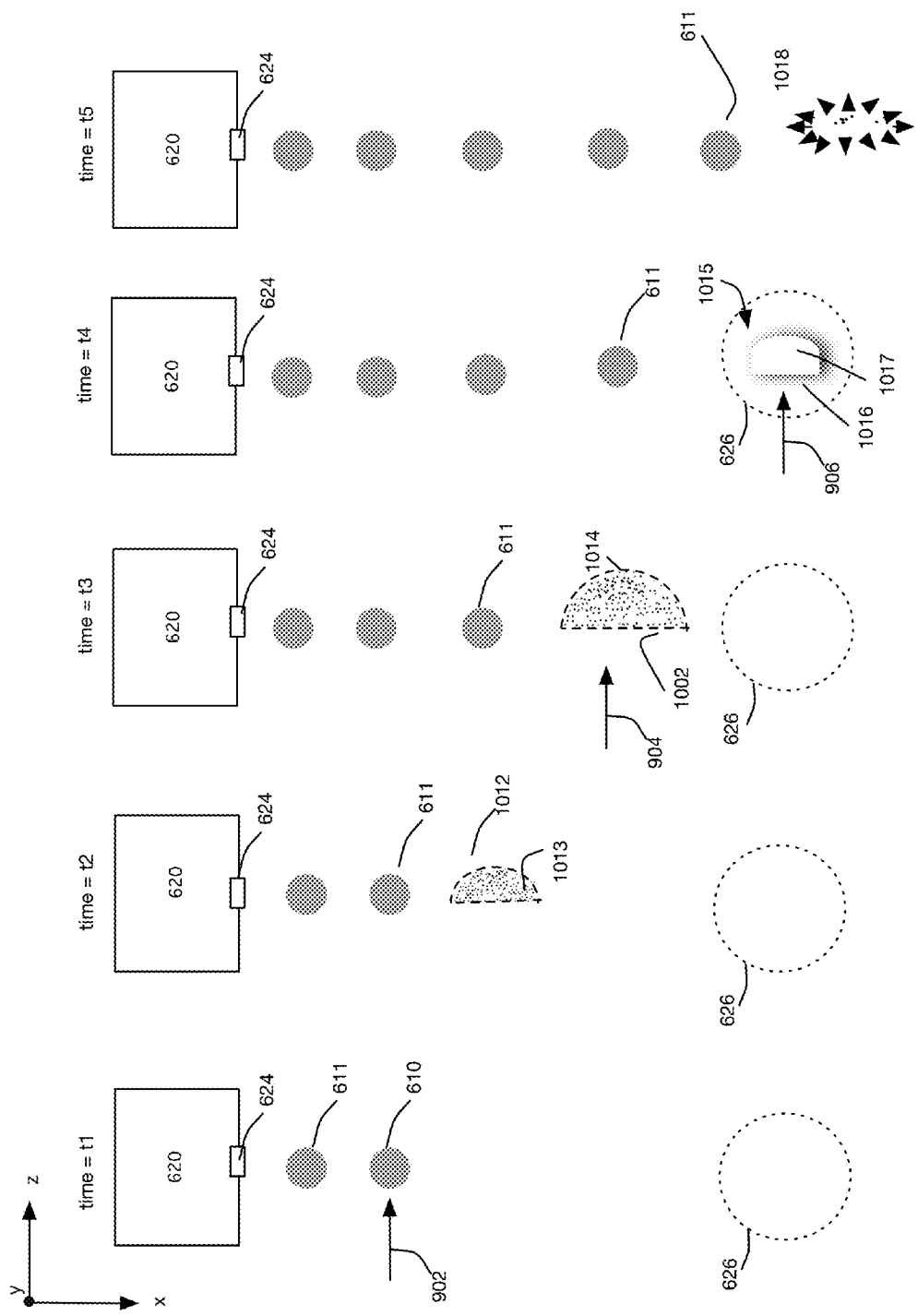

TARGET FOR LASER PRODUCED PLASMA EXTREME ULTRAVIOLET LIGHT SOURCE

CROSS-REFERENCE TO RELATED APPLICATION

This application is a continuation of U.S. patent application Ser. No. 14/563,186, filed Dec. 8, 2014, now allowed, and entitled TARGET FOR LASER PRODUCED PLASMA EXTREME ULTRAVIOLET LIGHT SOURCE, which is a continuation of U.S. patent Ser. No. 14/152,881, filed Jan. 10, 2014, now issued, and titled TARGET FOR LASER PRODUCED PLASMA EXTREME ULTRAVIOLET LIGHT SOURCE, which is a continuation of U.S. patent application Ser. No. 13/830,461, filed Mar. 14, 2013, now issued, and titled TARGET FOR LASER PRODUCED PLASMA EXTREME ULTRAVIOLET LIGHT SOURCE, each of which is incorporated herein by reference in its entirety.

TECHNICAL FIELD

The disclosed subject matter relates to a target for a laser produced plasma extreme ultraviolet light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In one general aspect, a method of generating EUV light includes directing a first pulse of radiation toward a target material droplet to form a modified droplet, the first pulse of radiation having an energy sufficient to alter a shape of the target material droplet; directing a second pulse of radiation toward the modified droplet to form an absorption material, the second pulse of radiation having an energy sufficient to change a property of the modified droplet, the property being related to absorption of radiation; and directing an amplified light beam toward the absorption material, the amplified light beam having an energy sufficient to convert at least a portion of the absorption material into extreme ultraviolet (EUV) light.

Implementations can include one or more of the following features. The modified droplet can include a continuous segment of the target material that has a width extending along a first direction, and a thickness extending along a second direction that is different from the first direction. The second direction is in the direction of propagation of the second pulse of radiation, and the width is greater than the thickness. A plane that includes the first direction can be angled relative to the direction of propagation of the second pulse of radiation. The absorption material can include a continuous segment of the target material.

The property of the modified droplet can be one or more of an electron density and an ion density, and the absorption material can include plasma adjacent to a surface of a continuous segment of the target material. The property of the modified droplet can be a surface area. The absorption material can include multiple pieces of the target material, the multiple pieces having a collective surface area that is larger than the modified droplet.

The first pulse of radiation can be a pulse of light having a wavelength of 10 μm, a pulse duration of 40 ns, and an energy of 20 mJ, and the second pulse of radiation can be a pulse of light wavelength of 1 μm, a pulse duration of 10 ns, and an energy of 5 mJ.

The first pulse of radiation can be a pulse of light having a wavelength of 10 μm, a pulse duration of 20-70 ns, and an energy of 15-60 mJ, and the second pulse of radiation can be a pulse of light wavelength of 1-10 μm, a pulse duration of 10 ns, and an energy of 1-10 mJ.

The first pulse of radiation can be a pulse of light having a wavelength of 1-10 μm, a pulse duration of 40 ns, and an energy of 20 mJ, and the second pulse of radiation can be a pulse of light having a wavelength of 1 μm, a pulse duration of 10 ns, and an energy of 1 mJ.

The first pulse of radiation and the second pulse of radiation can be pulses of light having a duration of 1 ns or greater.

The second pulse of radiation can be a pulse of light having a duration of 1 ns to 100 ns.

The second pulse of radiation can be directed toward the modified droplet 1-3 μs after the first pulse of radiation is directed toward the target material droplet.

The first pulse of radiation can be a pulse of light having a duration of at least 1 ns, and the second pulse of radiation can be a pulse of light having a duration of at least 1 ns.

In some implementations, at least 2% of the amplified light beam can be converted to EUV radiation.

The amplified light beam can be a pulse of light, and a subsequent pulse of light can be directed toward a second absorption material no more than 25 μs after the amplified light beam is directed toward the absorption material. The second absorption material is formed after the absorption material and is formed from a second target material droplet.

The first pulse of radiation can be a pulse of radiation having a duration of 300 ps or less. The first pulse of radiation can be a pulse of radiation having a duration of 100 ps-300 ps. The modified droplet can be a hemisphere shaped volume of particles of target material.

In another general aspect, an extreme ultraviolet light source includes a source that produces an amplified light beam, a first pulse of radiation, and a second pulse of radiation; a target material delivery system; a vacuum chamber coupled to the target material delivery system; and a steering system configured to steer and focus the amplified light beam, the first pulse of radiation, and the second pulse of radiation toward a target location that receives target material from the target material delivery system in the vacuum chamber. The first pulse of radiation has an energy sufficient to alter a shape of the target material droplet to create a modified droplet, the second pulse of radiation has an energy sufficient to change a property of the modified droplet that is related to absorption of radiation, and the amplified light beam is sufficient to convert at least a portion of the absorption material into extreme ultraviolet (EUV) light.

Implementations can include one or more of the following features. The source can include first, second, and third sources, with the first source generating the first pulse of radiation, the second source generating the second pulse of radiation, and the third source generating the amplified light beam.

The source can include a first source that generates the amplified light beam and the first pulse of radiation and a second source that generates the second pulse of radiation.

The first source can include a $CO_2$ laser, and the amplified light beam and the first pulse of radiation can have different wavelengths.

Implementations of any of the techniques described above may include a target for a laser produced plasma EUV light source, an EUV light source, a system for retrofitting an EUV light source, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

FIG. 1A shows a target material droplet that is converted to an exemplary target.

FIG. 1B is a plot of an exemplary waveform for generating the target of FIG. 1A.

FIG. 4 is a flow chart of an exemplary process for producing EUV light.

FIGS. 6A-6E are side views of a target material droplet transforming into a target through interactions with the waveform of FIG. 5.

FIGS. 6F and 6G are side views of the intermediate target of FIG. 6C.

FIGS. 8A-8E are side views of a target material droplet transforming into a target through interactions with the waveform of FIG. 7.

FIG. 9 is a plot of another exemplary waveform for generating EUV light.

FIGS. 10A-10E are side views of a target material droplet transforming into a target through interactions with the waveform of FIG. 9.

DESCRIPTION

Figure 1C:
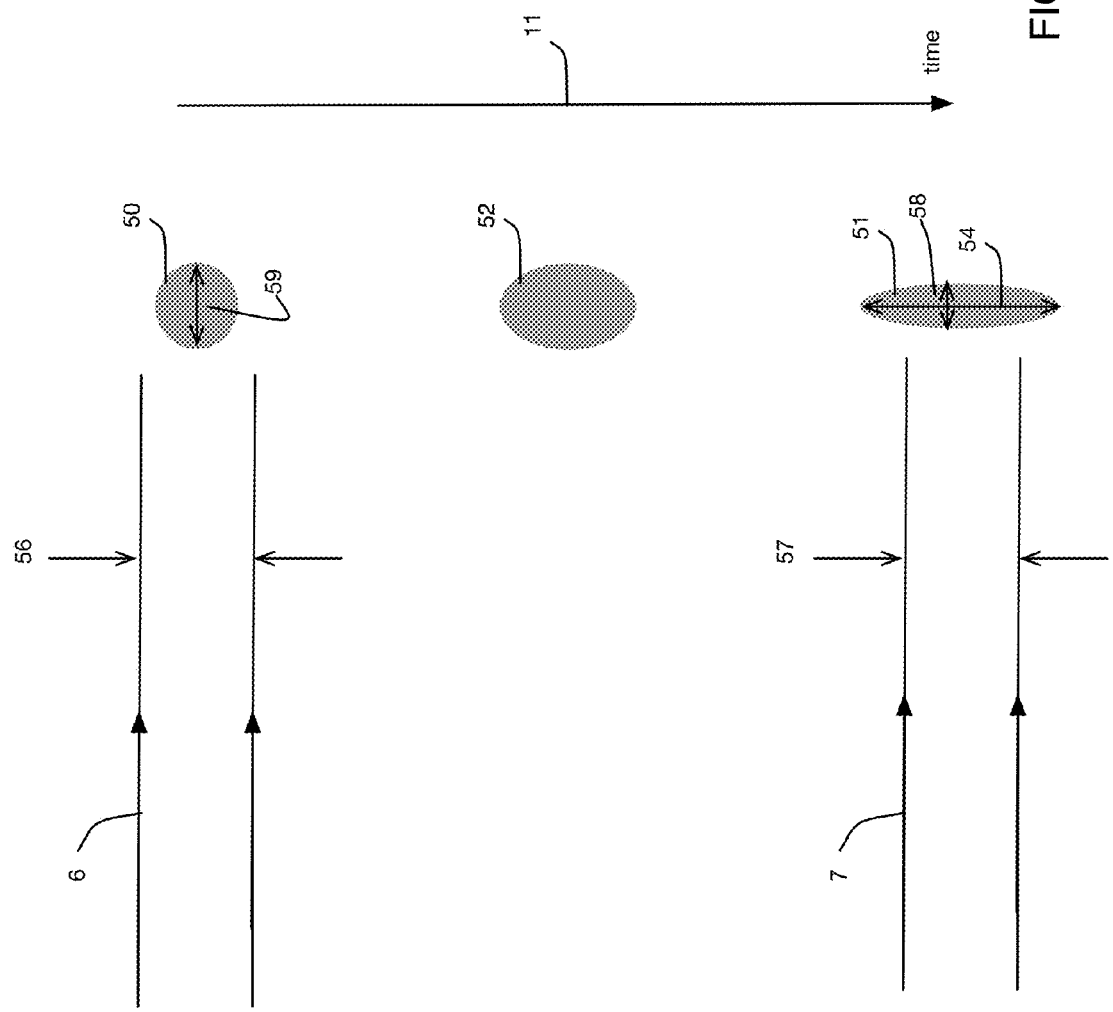
FIG. 1C shows side views of two pulses of radiation striking target material.

Techniques for producing a target for use in a laser produced plasma (LPP) extreme ultraviolet (EUV) light source are disclosed. The target is produced by irradiating a target material with two pulses of light in succession. The first pulse generates an intermediate target and the second pulse interacts with the intermediate target to produce the target. The target is then irradiated with an amplified light beam having energy that is sufficient to convert target material in the target to a plasma that emits EUV light. In some implementations, each of the two pulses of light has a temporal duration or pulse width of at least 1 nanosecond (ns).

Referring to FIGS. 1A and 1B, an exemplary waveform 5 transforms a target material 50 into a target 55. The target 55 includes target material that emits EUV light 57 when converted to plasma. The target material 50 can be a target mixture that includes a target substance and impurities such as non-target particles. The target substance is the substance that is converted to a plasma state that has an emission line in the EUV range. The target substance can be, for example, a droplet of liquid or molten metal, a portion of a liquid stream, solid particles or clusters, solid particles contained within liquid droplets, a foam of target material, or solid particles contained within a portion of a liquid stream. The target substance, can be, for example, water, tin, lithium, xenon, or any material that, when converted to a plasma state, has an emission line in the EUV range. For example, the target substance can be the element tin, which can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. Moreover, in the situation in which there are no impurities, the target material includes only the target substance. The discussion below provides an example in which the target material 50 is a target material droplet made of molten metal. The target material 50 is referred to as the target material droplet 50. However, the target material 50 can take other forms.

FIG. 1A shows the target material droplet 50 physically transforming into an intermediate target 51 and then into the target 55 over a time period. The target material droplet 50 is transformed through interaction with the radiation delivered in time according to the waveform 5. FIG. 1B is a plot of the energy in the waveform 5 as a function of time over the time period of FIG. 1A. As compared to the target material droplet 50 and the intermediate target 51, the target 55 absorbs more of an amplified light beam 8 and converts a larger portion of the energy in the amplified light beam 8 to the EUV light 57.

The waveform 5 is a representation of the energy that interacts with the target material droplet 50 and its modified forms over time. Although the waveform 5 is shown as a single waveform as a function of time, various portions of the waveform 5 can be produced by different sources. The waveform 5 includes a representation of a first pulse of radiation 6 (a first pre-pulse 6) and a representation of a second pulse of radiation 7 (a second pre-pulse 7). The first pre-pulse 6 and the second pre-pulse 7 can be any type of pulsed radiation that has sufficient energy to act on the target material droplet 50 and the intermediate target 51, respectively. Examples of pre-pulses are discussed with respect to FIGS. 3A-3D, 4, 5, 7 and 9.

The first pre-pulse 6 occurs at a time $t=t_1$ and has a pulse duration 12, and the second pre-pulse 7 occurs at a time $t=t_2$ and has a pulse duration 14. The pulse duration can be represented by the full width at half maximum, the amount of time that the pulse has an intensity that is at least half of the maximum intensity of the pulse. However, other metrics can be used to determine the pulse duration. The times $t_1$ and $t_2$ are separated by a first delay time 11, with the second pre-pulse 7 occurring after the first pre-pulse 6.

The waveform 5 also shows a representation of the amplified light beam 8. The amplified light beam 8 can be referred to as the main beam or the main pulse. The amplified light beam 8 has sufficient energy to convert target material in the target 55 to plasma that emits EUV light. The second pre-pulse 7 and the amplified light beam 8 are separated in time by a second delay time 13, with the amplified light beam 8 occurring after the second pre-pulse 7.

Examples of an EUV light source that can produce and/or use the target 55 are shown in FIGS. 2A, 2B, and 3A-3E. Before discussing the EUV light sources, a discussion of the interactions of the pulses of light, including the first pre-pulse 6 and the second pre-pulse 7, with the target material droplet 50 and the intermediate target 51 is provided.

When a laser pulse impinges (strikes) a target material droplet that is metallic, the leading edge of the pulse sees (interacts with) a surface that is a reflective metal. The target material droplet 50 reflects most of the energy in the leading edge of the pulse and absorbs little. The small amount that is absorbed heats the surface of the droplet, evaporating and ablating the surface. The target material that is evaporated from the surface of the droplet forms a cloud of electrons and ions close to the surface. As the pulse of radiation continues to impinge on the target material droplet, the electric field of the laser pulse can cause the electrons in the cloud to move. The moving electrons collide with nearby ions, heating the ions through the transfer of kinetic energy at a rate that is roughly proportional to the product of the densities of the electrons and the ions in the cloud. Through the combination of the moving electrons striking the ions and the heating of the ions, the cloud absorbs the pulse.

As the cloud is exposed to the later parts of the laser pulse, the electrons in the cloud continue to move and collide with ions, and the ions in the cloud continue to heat. The electrons spread out and transfer heat to the surface of the target material droplet (or bulk material that underlies the cloud), further evaporating the surface of the target material droplet. The electron density in the cloud increases in the portion of the cloud that is closest to the surface of the target material droplet. The cloud can reach a point where the density of electrons increases such that the portions of the cloud reflect the laser pulse instead of absorbing it.

The present technique for generating a target for an LPP EUV light source applies two pre-pulses to a target material droplet to physically transform the target material droplet into a target that more readily absorbs energy. The first pre-pulse 6 forms a geometric distribution of target material that becomes the intermediate target 51. The second pre-pulse 7 transforms the intermediate target 51 into the target 55. The first pre-pulse 6 and the second pre-pulse 7 are discussed in turn below.

Referring also to FIG. 1C, the first pre-pulse 6 physically transforms the target material droplet into a geometric distribution 52 of target material. The geometric distribution 52 can be a material that is not ionized (a material that is not a plasma). The geometric distribution 52 can be, for example, a disk of liquid or molten metal, a continuous segment of target material that does not have voids or substantial gaps, a mist of micro- or nano-particles, or a cloud of atomic vapor. The geometric distribution 52 expands spatially during the first delay time 11 and becomes the intermediate target 51. The first pre-pulse 6 spreads the target material droplet 50 spatially. Spreading the target material droplet 50 can have two effects.

First, the intermediate target 51 generated by the first pre-pulse 6 has a form that presents a larger area to an oncoming pulse of radiation (such as the pre-pulse 7). The intermediate target 51 has a cross-sectional diameter 54 that is larger than a beam diameter 57 of the pre-pulse 7 such that the intermediate target receives the entire pre-pulse 7. Additionally, the intermediate target 51 can have a thickness 58 that is thinner in a direction of propagation of the pre-pulse 7 than a thickness 59 of the target material droplet 50. The relative thinness of the intermediate target 51 allows the pre-pulse beam 7 to irradiate more of the target material that is in the intermediate target 51, including more of the target material that is not irradiated by the pre-pulse 7 when it initially reaches the intermediate target 51.

Second, spreading the target material of the droplet 50 out spatially can minimize the occurrence of regions of excessively high material density during heating of the plasma by the strong pulse 8, which can block generated EUV light. If the plasma density is high throughout a region that is irradiated with a laser pulse, absorption of the laser pulse is limited to the portions of the region that receives the laser pulse first. Heat generated by this absorption may be too distant from the bulk target material to maintain the process of evaporating and heating of the target material surface long enough to utilize (evaporate) a meaningful amount of the bulk target material during the finite duration of the pulse 8. In instances where the region has a high electron density, the light pulse only penetrates a fraction of the way into the region before reaching a "critical surface" where the electron density is so high that the light pulse is reflected. The light pulse cannot travel into those portions of the region and little EUV light is generated from target material in those regions. The region of high plasma density can also block EUV light that is emitted from the portions of the region that do emit EUV light. Consequently, the total amount of EUV light that is emitted from the region is less than it would be if the region lacked the portions of high plasma density. As such, spreading the target material droplet 10 into the larger volume of the intermediate target 51 means that an incident light beam reaches more of the material in the intermediate target 51 before being reflected. This can increase the amount of EUV light subsequently produced.

The waveform 5 also shows a representation of the second pre-pulse 7. The second pre-pulse 7 impinges on the intermediate target 51 and forms the target 55 before the amplified light beam 8 arrives. The target 55 can take many forms. For example, the target 55 can be a pre-plasma that is spatially near to a bulk target material. A pre-plasma is a plasma that is used to enhance absorption of incident light (such as the pre-pulse 7 or the amplified light beam). Although the pre-plasma can emit small amounts of EUV light in some instances, the EUV light that is emitted is not of the wavelength or amount that is emitted by the target 55. In other implementations, the target 55 is a volume of fragments or a mist of target material. An example of a waveform that includes a second pre-pulse that can form a pre-plasma is discussed below with respect to FIG. 5. An example of a waveform that includes a second pre-pulse that can form fragments of target material is discussed below with respect to FIG. 7. In yet other implementations, the target 55 is a pre-plasma formed close to a collection of particles of target material distributed throughout a hemisphere shaped volume. An example of such a target is discussed below with respect to FIG. 9.

In some implementations, the pulse duration 12 of the first pre-pulse 6 and the pulse duration 14 of the second pre-pulse 7 are 1 ns or greater. Using two pre-pulses that are greater than 1 ns allows the target 55 to be produced using pulses of radiation that are generated without using a laser that generates picosecond (ps) or shorter pulses. Lasers that emit ns-duration pulses and have relatively high repetition rates (50 kHz-100 kHz) can be more readily available than those that emit ps-pulses. Use of higher-repetition rate ns-pulse generating lasers to generate the pre-pulses 6 and 7 allows an EUV light source that uses the target 55 to have a higher overall system repetition rate.

Figure 1D:
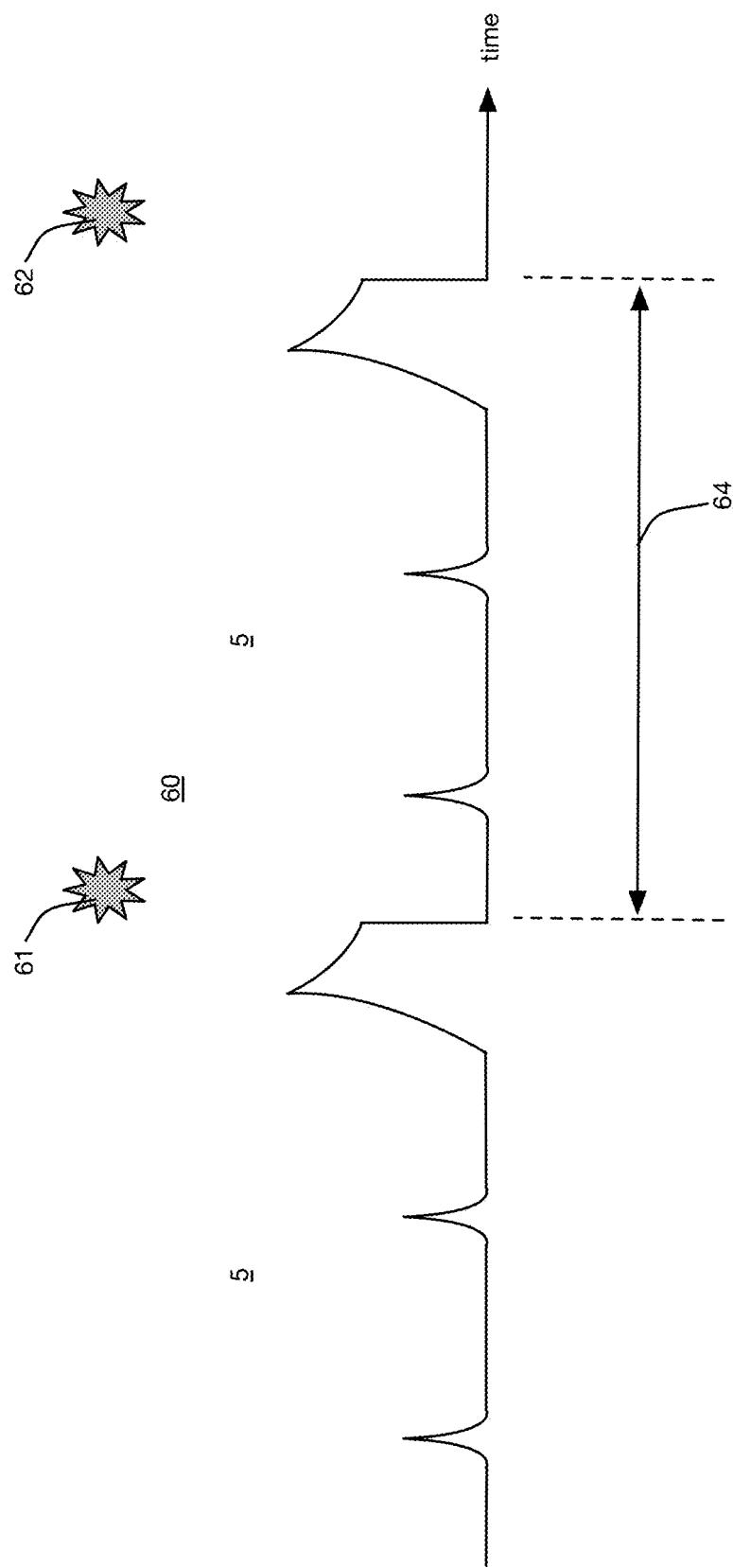
FIG. 1D is a plot of an exemplary waveform for an EUV light source.

FIG. 1D shows an exemplary plot of a waveform 60 over two continuous cycles of an EUV light source. The waveform 60 is two instances of the waveform 5 (FIG. 1A), with each cycle of the EUV light source applying an instance of the waveform 5 to two separate target material droplets (one per cycle) to emit EUV light once per cycle. In the example shown in FIG. 1D, EUV light emissions 61 and 62 occur after an instance of the waveform 5 is applied to a target material droplet. The emissions 61 and 62 are separated in time by a time 64 that is the inverse of the repetition rate of the EUV light source. The repetition rate of the EUV light source also can be considered as the minimum amount of time between two successive EUV light emissions. Because the time between the EUV light emissions 61 and 62 depends on how quickly instances of the waveform 5 can be generated, the repetition rate of the sources that generate the pre-pulses 6 and 7 at least partially determines the system repetition rate. When using two ns-duration pulses as the pre-pulses 6 and 7, the EUV light source's system repetition rate can be, for example, 40 kHz-100 kHz.

Although the example of FIG. 1D shows continuous emission of EUV light, where EUV light is emitted at periodic intervals determined by the system repetition rate, the EUV light source can be operated in other modes depending on the needs of a lithography tool that receives the generated EUV light. For example, the EUV light source also can be operated or set to emit EUV light in bursts that are separated in time by an amount greater than the system repetition rate or at an irregular interval. The system repetition rate discussed with respect to FIG. 1A is provided as an example of a minimum amount of time between EUV light emissions.

FIGS. 2A, 2B, and 3A-3C show exemplary LPP EUV light sources in which the target 55 can be used.

Figure 2A:
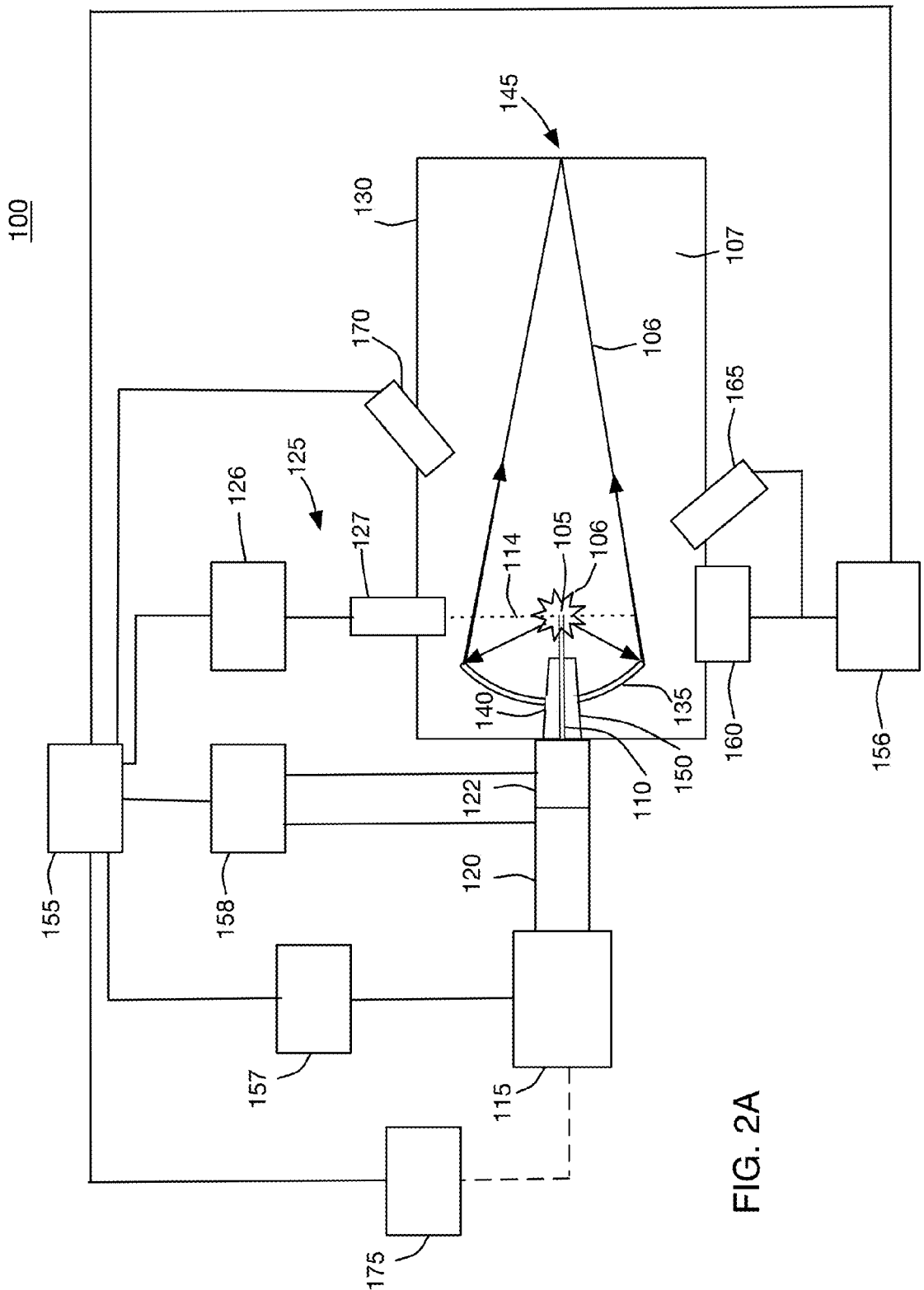
FIG. 2A is a block diagram of a laser produced plasma extreme ultraviolet light source.

Referring to FIG. 2A, an LPP EUV light source 100 is formed by irradiating a target mixture 114 at a target location 105 with an amplified light beam 110 that travels along a beam path toward the target mixture 114. The target location 105, which is also referred to as the irradiation site, is within an interior 107 of a vacuum chamber 130. When the amplified light beam 110 strikes the target mixture 114, a target material within the target mixture 114 is converted into a plasma state that has an element with an emission line in the EUV range. The created plasma has certain characteristics that depend on the composition of the target material within the target mixture 114. These characteristics can include the wavelength of the EUV light produced by the plasma and the type and amount of debris released from the plasma.

The light source 100 also includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 can also include impurities such as non-target particles. The target mixture 114 is delivered by the target material delivery system 125 into the interior 107 of the chamber 130 and to the target location 105.

The light source 100 includes a drive laser system 115 that produces the amplified light beam 110 due to a population inversion within the gain medium or mediums of the laser system 115. The light source 100 includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified (externally or within a gain medium in the oscillator) and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10.6 µm, at a gain greater than or equal to 1000. In some examples, the optical amplifiers amplify light at a wavelength of 10.59 µm. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the laser system 115 can also include a cooling system such as water that can be used when operating the laser system 115 at higher powers.

Figure 2B:
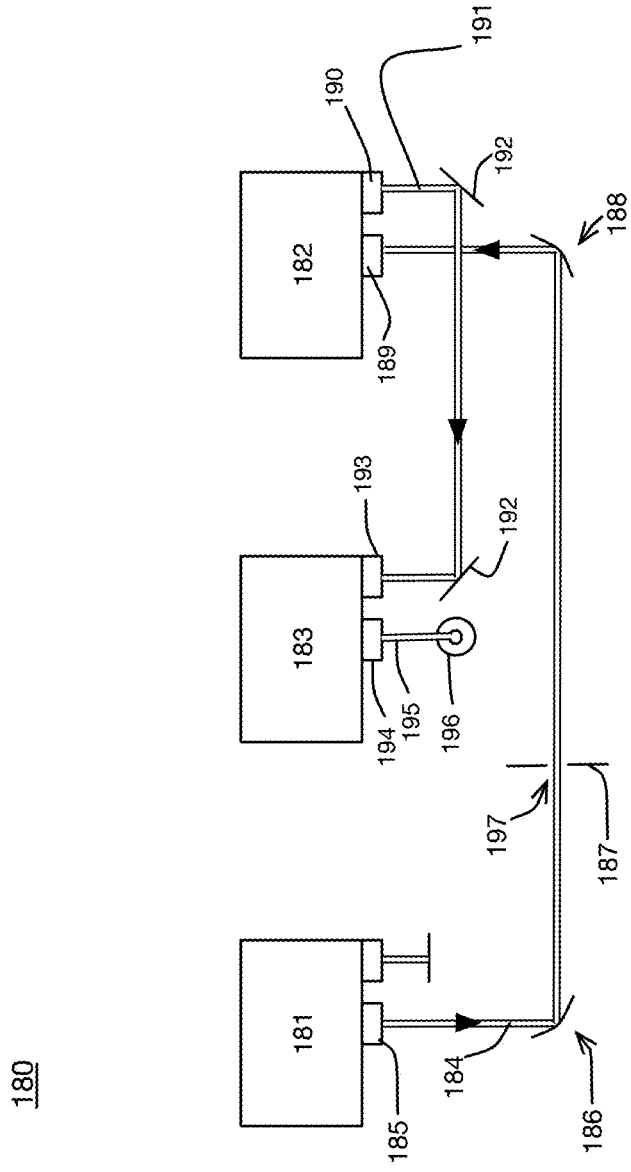
FIG. 2B is a block diagram of an example of a drive laser system that can be used in the light source of FIG. 2A.

FIG. 2B shows a block diagram of an example drive laser system 180. The drive laser system 180 can be used as the drive laser system 115 in the source 100. The drive laser system 180 includes three power amplifiers 181, 182, and 183. Any or all of the power amplifiers 181, 182, and 183 can include internal optical elements (not shown). The power amplifiers 181, 182, and 183 each include a gain medium in which amplification occurs when pumped with an external electrical or optical source.

Light 184 exits from the power amplifier 181 through an output window 185 and is reflected off a curved mirror 186. After reflection, the light 184 passes through a spatial filter 187, is reflected off of a curved mirror 188, and enters the power amplifier 182 through an input window 189. The light 184 is amplified in the power amplifier 182 and redirected out of the power amplifier 182 through an output window 190 as light 191. The light 191 is directed toward the amplifier 183 with fold mirrors 192 and enters the amplifier 183 through an input window 193. The amplifier 183 amplifies the light 191 and directs the light 191 out of the amplifier 183 through an output window 194 as an output beam 195. A fold mirror 196 directs the output beam 195 upwards (out of the page) and toward the beam transport system 120.

The spatial filter 187 defines an aperture 197, which can be, for example, a circle through which the light 184 passes. The curved mirrors 186 and 188 can be, for example, off-axis parabola mirrors with focal lengths of about 1.7 m and 2.3 m, respectively. The spatial filter 187 can be positioned such that the aperture 197 coincides with a focal point of the drive laser system 180. The example of FIG. 2B shows three power amplifiers. However, more or fewer power amplifiers can be used.

Referring again to FIG. 2A, the light source 100 includes a collector mirror 135 having an aperture 140 to allow the amplified light beam 110 to pass through and reach the target location 105. The collector mirror 135 can be, for example, an ellipsoidal mirror that has a primary focus at the target location 105 and a secondary focus at an intermediate location 145 (also called an intermediate focus) where the EUV light 106 can be output from the light source 100 and can be input to, for example, an integrated circuit beam positioning system tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable in response to a signal from the master controller 155, for example, to modify the release point of the droplets as released by a target material supply apparatus 127 to correct for errors in the droplets arriving at the desired target location 105.

Additionally, the light source 100 can include a light source detector 165 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 can also include a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120. The metrology system 124 can include an optical element that samples or re-directs a subset of the light, such optical element being made out of any material that can withstand the powers of the guide laser beam and the amplified light beam 110. A beam analysis system is formed from the metrology system 124 and the master controller 155 since the master controller 155 analyzes the sampled light from the guide laser 175 and uses this information to adjust components within the focus assembly 122 through the beam control system 158.

Thus, in summary, the light source 100 produces an amplified light beam 110 that is directed along the beam path to irradiate the target mixture 114 at the target location 105 to convert the target material within the mixture 114 into plasma that emits light in the EUV range. The amplified light beam 110 operates at a particular wavelength (that is also referred to as a source wavelength) that is determined based on the design and properties of the laser system 115. Additionally, the amplified light beam 110 can be a laser beam when the target material provides enough feedback back into the laser system 115 to produce coherent laser light or if the drive laser system 115 includes suitable optical feedback to form a laser cavity.

Figure 3A:
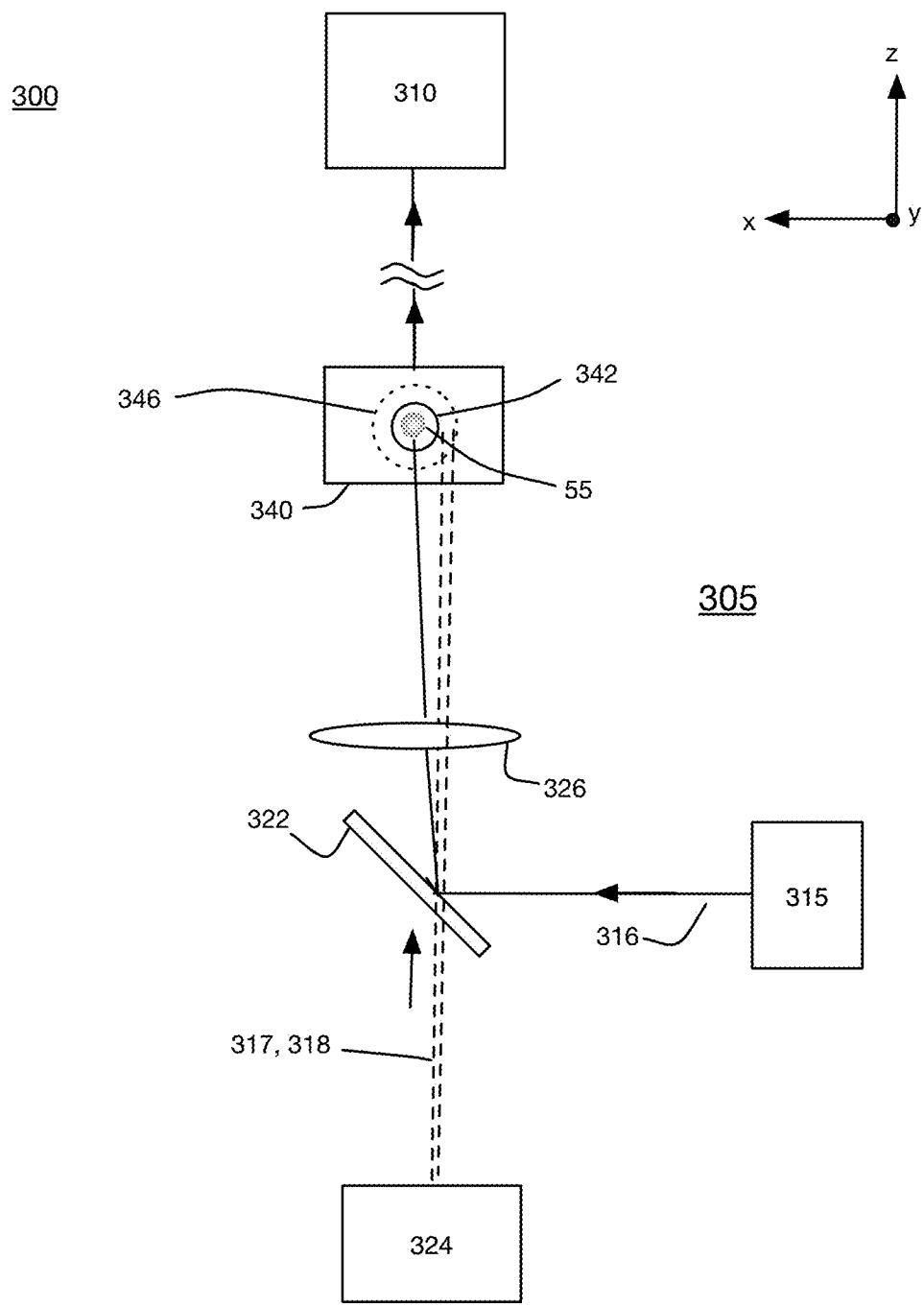
FIG. 3A is a top plan view of another laser produced plasma extreme ultraviolet (EUV) light source and a lithography tool coupled to the EUV light source.

Referring to FIG. 3A, a top plan view of an exemplary optical imaging system 300 is shown. The optical imaging system 300 includes an LPP EUV light source 305 that provides EUV light to a lithography tool 310. The light source 305 can be similar to, and/or include some or all of the components of, the light source 100 of FIGS. 2A and 2B. As discussed below, the target 55 can be used in the light source 305 to increase the amount of light emitted by the light source 305.

The light source 305 includes a drive laser system 315, an optical element 322, a pre-pulse source 324, a focusing assembly 326, a vacuum chamber 340, and a EUV collecting optic 346. The EUV collecting optic 346 directs the EUV light emitted by the target 55 to the lithography tool 310. The EUV collecting optic 346 can be the collector mirror 135 of FIG. 2A.

The drive laser system 315 produces an amplified light beam 316. The amplified light beam 316 can be similar to the amplified light beam 18 of FIGS. 1A-1C and can be referred to as a main pulse or a main beam. The amplified light beam 316 has an energy sufficient to convert target material in the target 55 into plasma that emits EUV light.

The pre-pulse source 324 emits pulses of radiation 317 and 318. The pulses of radiation 317 and 318 can be similar to the first pre-pulse 6 and the second pre-pulse 7 of FIG. 1B. The pre-pulse source 324 can be, for example, a Q-switched Nd:YAG laser that operates at a 50 kHz repetition rate, and the pulses of radiation 317 and 318 can be pulses from the Nd:YAG laser that have a wavelength of 1.06 µm. The repetition rate of the pre-pulse source 324 indicates how often the pre-pulse source 324 produces a pulse of radiation. For the example where the pre-pulse source 324 has a 50 kHz repetition rate, a pulse of radiation 317 is emitted from the source 324 every 20 microseconds (µs).

Other sources can be used as the pre-pulse source 324. For example, the pre-pulse source 324 can be any rare-earth-doped solid state laser other that an Nd:YAG, such as an erbium-doped fiber (Er:glass) laser. The pre-pulse source 324 can be any other radiation or light source that produces light pulses that have an energy and wavelength used for the first pre-pulse 6 and the second pre-pulse 7.

The optical element 322 directs the amplified light beam 316 and the pulses of radiation 317 and 318 from the pre-pulse source 324 to the chamber 340. The optical element 322 is any element that can direct the amplified light beam 316 and the pulses of radiation 317 and 318 along similar paths and deliver the amplified light beam 316 and the pulses of radiation 317 and 318 to the chamber 340. In the example shown in FIG. 3A, the optical element 322 is a dichroic beamsplitter that receives the amplified light beam 316 and reflects it toward the chamber 340. The optical element 322 receives the pulses of radiation 317 and 318 and transmits the pulses toward the optical chamber 340. The dichroic beamsplitter has a coating that reflects the wavelength(s)s of the amplified light beam 316 and transmits the wavelength(s) of the pulses of radiation 317 and 318. The dichroic beamsplitter can be made of, for example, diamond.

In other implementations, the optical element 322 is a mirror that defines an aperture (not shown). In this implementation, the amplified light beam 316 is reflected from the mirror surface and directed toward the chamber 340, and the pulses of radiation pass through the aperture and propagate toward the chamber 340.

In still other implementations, a wedge-shaped optic (for example, a prism) can be used to separate the main pulse 316, the pre-pulse 317, and the pre-pulse 318 into different angles, according to their wavelengths. The wedge-shaped optic can be used in addition to the optical element 322, or it can be used as the optical element 322. The wedge-shaped optic can be positioned just upstream (in the "–z" direction) of the focusing assembly 326.

Additionally, the pulses 317 and 318 can be delivered to the chamber 340 in other ways. For example, the pulses 317 and 318 can travel through optical fibers that deliver the pulses 317 and 318 to the chamber 340 and/or the focusing assembly 326 without the use of the optical element 322 or other directing elements. In these implementations, the fibers bring the pulses of radiation 317 and 318 directly to an interior of the chamber 340 through an opening formed in a wall of the chamber 340.

Figure 3B:
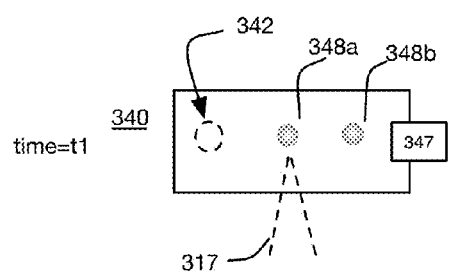
FIGS. 3B-3D are top views of a vacuum chamber of the EUV light source of FIG. 3A at three different times.
Figure 3C:
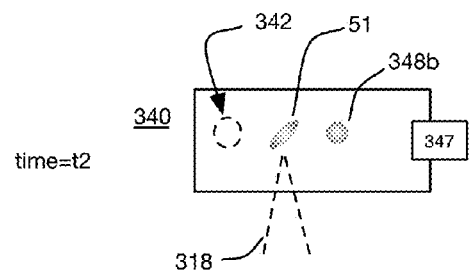
Figure 3D:
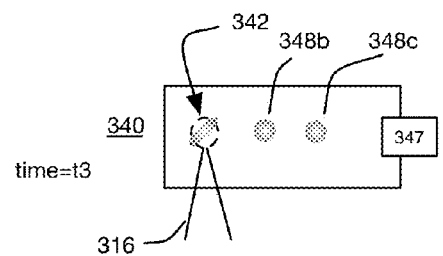

Returning to the example of FIG. 3A, the amplified light beam 316 from the drive laser system 315 is reflected from the optical element 322 and propagates through the focusing assembly 326. The focusing assembly 326 focuses the amplified light beam 316 onto the target location 342. The pulses of radiation 317 and 318 pass through the optical element 322 and are directed through the focusing assembly 326 to the chamber 340. Referring to FIGS. 3B-3D, each of the amplified light beam 316, the pulse of radiation 317, and the pulse of radiation 318 are directed to different locations along the "x" direction in the chamber 340.

Referring also to FIGS. 3B-3D, a top view of the target material supply apparatus 347 releasing a stream of target material droplets in the "x" direction toward the target location 342 is shown. The stream includes droplets 348a and 348b. The target location 342 is a location that receives the amplified light beam 316 and also can be at the focal point of the EUV collecting optic 346. FIG. 3B shows the chamber 340 at a time $t=t_1$, FIG. 3C shows the chamber 340 at a time $t=t_2$ that occurs after $t=t_1$, and FIG. 3C shows the chamber 340 at a time $t=t_3$, which occurs after $t=t_2$.

Each of the amplified light beam 316 and the pulses of radiation 317 and 318 are directed toward different locations along the "x" direction in the chamber 340 at different times. This allows a target material droplet to be converted into a target before reaching the target location 342. FIGS. 3B-3D show an example of a target material droplet (the target material droplet 348a) being converted into the target 55. A time=$t_1$ (FIG. 3B), the pulsed beam of radiation 317 irradiates the target material droplet 348a at the time "$t_1$" at location that is displaced in the "–x" direction from the target location 342. The pulsed beam of radiation 317 transforms the target material droplet 348b into the intermediate target 51. At the time=$t_2$ (FIG. 3C), the intermediate target 51 has moved in the "x" direction closer to the target location 342 and arrives at another location that is displaced in the "–x" direction relative to the target location 342. The pulse beam of radiation 318 irradiates the intermediate target 51 and transforms it into the target 55. The target 55 travels in the "x" direction and arrives at the target location 342 without being substantially ionized. In this manner, the target 55 can be a pre-formed target that is formed at a time before the target 55 enters the target location 342. At the time=$t_3$ (FIG. 3D), the amplified light beam 316 irradiates the target 55 to produce plasma that emits EUV light.

In the example shown in FIG. 3A, a single block represents the pre-pulse source 324. The pre-pulse source 324 can be a single light source or a plurality of light sources; for example, two separate sources can be used to generate the pulses 317 and 318. The two separate sources can be different types of sources that produce pulses of radiation having different wavelengths and energies. For example, the pulse 317 can have a wavelength of 10.6 μm and be generated by a $CO_2$ laser, and the pulse 318 can have a wavelength of 1.06 μm and be generated by a rare-earth-doped solid state laser.

In some implementations, the pulse of radiation 317 can be generated by the drive laser system 315. For example, the drive laser system can include two $CO_2$ seed laser subsystems and one amplifier. One of the seed laser subsystems can produce an amplified light beam having a wavelength of 10.26 μm, and the other seed laser subsystem can produce an amplified light beam having a wavelength of 10.59 μm. These two wavelengths can come from different lines of the $CO_2$ laser. In other examples, other lines of the $CO_2$ laser can be used to generate the two amplified light beams. Both amplified light beams from the two seed laser subsystems are amplified in the same power amplifier chain and then angularly dispersed to reach different locations within the chamber 340. The amplified light beam with the wavelength of 10.26 μm can be used as the pre-pulse 317, and the amplified light beam with the wavelength of 10.59 μm can be used as the amplified light beam 316.

Moreover, the amplified light beam 316, the pulse of radiation 317, and the pulse of radiation 318 are all amplified in the same amplifier. For example, the three power amplifiers 181, 182, and 183 (FIG. 1B) can be used to amplify all of the amplified light beam 316, the pre-pulse 317, and the pre-pulse 318. In this implementation, the amplifier can have three seed lasers, one of which is used to generate each of the amplified light beam 316, the pulse of radiation 317, and the pulse of radiation 318. More or fewer seed lasers can be used.

Referring to FIG. 4, a flow chart of an example process 400 for generating EUV light is shown. The process 400 can be performed using the light source 100 or the light source 305.

A first pulse of radiation is directed toward a target material droplet to form an altered droplet (410). The first pulse of radiation can be a pulse that has an energy that is sufficient to alter a shape of the target material droplet. The first pulse of radiation can have a duration of at least 1 ns, for example, the first pulse of radiation can have a duration of 1-100 ns and a wavelength of 1 μm or 10 μm. In one example, the first pulse of radiation can be a laser pulse that has energy of 15-60 mJ, a pulse duration of 20-70 ns, and a wavelength of 1-10 μm. In some examples, the first pulse of radiation can have a duration of less than 1 ns. For example, the first pulse of radiation can have a duration of 300 ps or less, 100 ps or less, between 100-300 ps, or between 10-100 ps.

The first pulse of radiation can be the first pre-pulse 6 (FIG. 1B) or the pulse of radiation 317 (FIGS. 3A-3D). The altered droplet can be the intermediate target 51 (FIG. 1A) that is formed by irradiating the target material droplet 50 with the first pre-pulse 6. The target material droplet 50 can be a droplet of molten metal, such as tin or any other material that emits EUV when converted to plasma. For example, the altered droplet can be a disk of molten tin formed by striking the target material droplet 50 with the first pre-pulse 6. The force of the impact of the first pre-pulse 6 can deform the droplet into a shape that is closer to a disk that expands, after about 1-3 microseconds ($\mu$s), into a disk shaped piece of molten metal. In this example, the disk shaped piece can be considered the intermediate target 51. FIGS. 6C and 8C show an exemplary intermediate target 613 that is disk shaped.

The altered droplet or intermediate target can take other geometric forms. For example, in implementations in which the first pulse of radiation is less than 1 ns in duration, the altered droplet can have a shape that is formed from slicing a spheroid along a plane, such as a hemisphere like shape. FIG. 10C shows an exemplary intermediate target 1014 that has a hemisphere shape. In the example shown in FIG. 10C, the intermediate target 1014 is a volume of particles instead of a disk shaped segment of molten tin.

A second pulse of radiation is directed toward the altered droplet to form an absorption material (420). The absorption material is the target 55 that receives the amplified light beam and is converted to plasma (by ionization due to the interaction of the amplified light beam with the target 55) that emits EUV light. The second pulse of radiation has energy sufficient to change a property of the altered droplet that is related to absorption of radiation. In other words, striking the altered droplet formed in (420) with the second pulse of radiation changes the ability of the altered droplet to absorb radiation, such as light. Further, the property related to absorption of radiation is changed such that the absorption material is able to absorb a higher portion of incident radiation than the altered droplet.

The second pulse of radiation can have a duration of at least 1 ns and an energy of 1-10 mJ. For example, the second pulse of radiation can have a duration of 10 ns and an energy of 5 mJ. The second pulse of radiation can have a wavelength of 1.06 $\mu$m. The second pulse of radiation can be the second pre-pulse 7 (FIG. 1B) or the pulse of radiation 318 (FIGS. 3A-3D). Although the energy of the second pulse of radiation can be lower and/or the pulse duration can be longer than a pre-pulse applied directly to the target material droplet, the absorption material (such as the target 55) has physical properties that make the target 55 favorable for generating EUV light.

Figure 7:
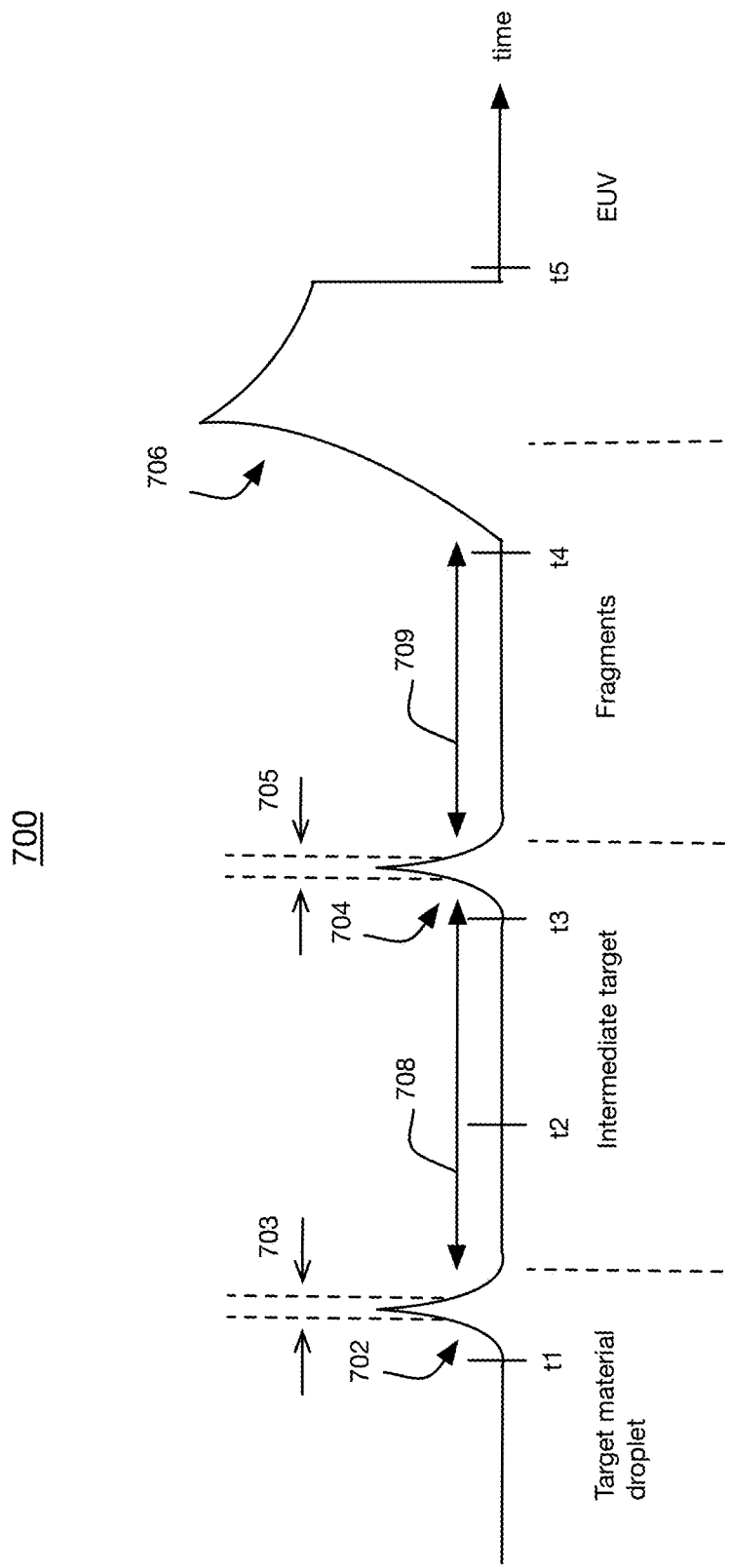
FIG. 7 is a plot of another exemplary waveform for generating EUV light.

In one example, the intermediate target 51 is a disk of molten tin that, as compared to the target material droplet 50, is thinner along a direction of propagation of an incident pulse of radiation. This intermediate target 51 is more easily broken into fragments of target material than the target material droplet 50, and a smaller amount of energy may be needed to fragment the intermediate target 51. In this example, the second pulse of radiation transforms the intermediate target 51 into a cloud of pieces of target material that, taken together or collectively, have a greater surface area of target material in the path of an oncoming pulse of radiation as compared to the target material droplet 50. The greater surface area provides more target material for interaction with an amplified light beam and can lead to increased ionization of the target material and therefore increased EUV light generation. FIG. 7 shows an example of a second pulse of radiation that transforms the intermediate target 51 into a target 55 that includes fragments of target material.

Figure 5:
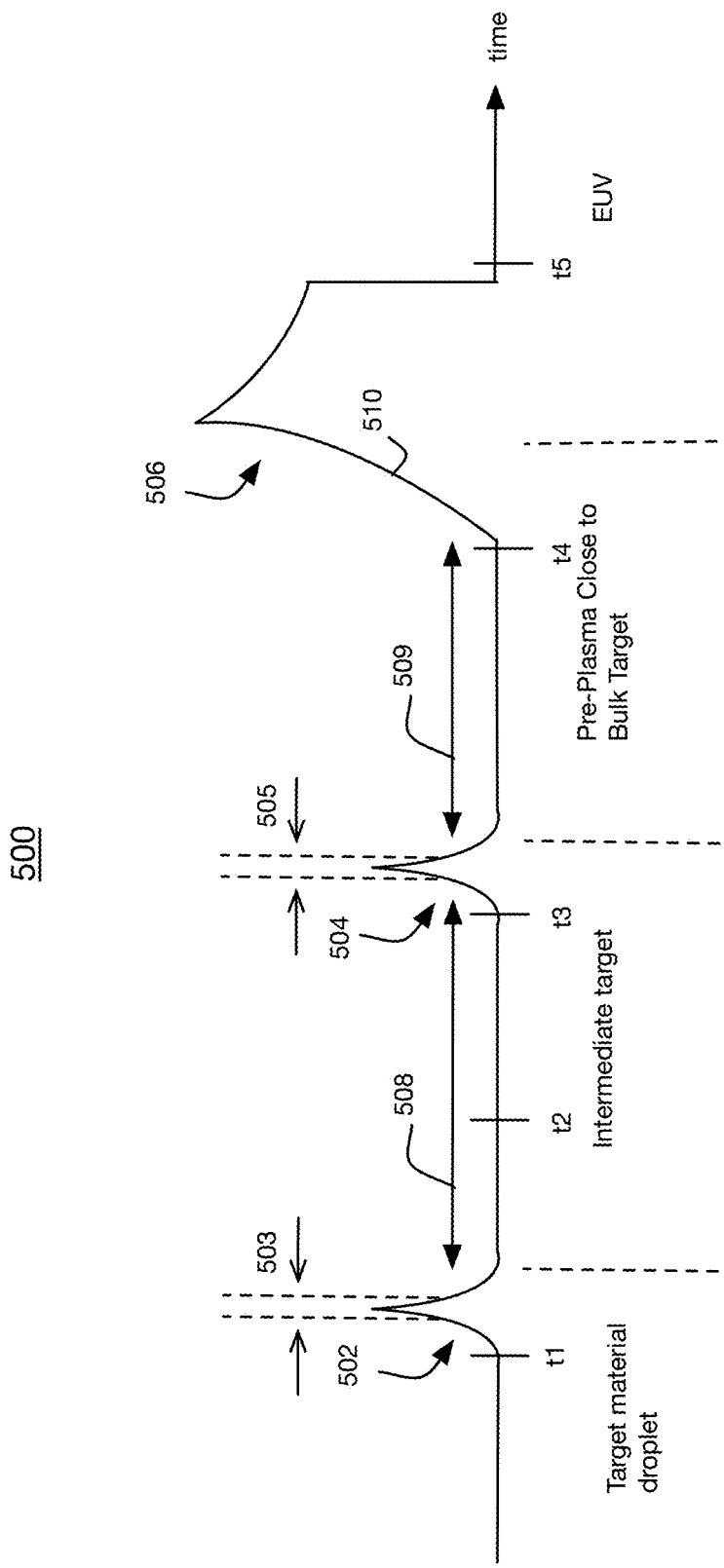
FIG. 5 is a plot of another exemplary waveform for generating EUV light.

In another example, the intermediate target 51 is again a disk of molten tin that is thinner and wider than the target material droplet. In this example, the second pre-pulse irradiates the intermediate target 51 and generates a cloud of electrons and ions (a pre-plasma) close to the surface of the intermediate target that receives the second pulse of radiation. By creating the cloud of electrons and ions at the surface of the intermediate target 51, the second pulse of radiation alters the electron density and/or the ion density of at least a portion of the intermediate target 51. FIG. 5 shows an example of a second pulse of radiation that changes the electron density and/or ion density of at least part of the modified droplet.

An amplified light beam is directed to the absorption material (430). The amplified light beam has energy sufficient to ionize and therefore convert target material in the absorption material (the intermediate target 51) into a plasma that emits EUV light. The amplified light beam can be the amplified light beam 8 (FIG. 1B).

The target 55 and the waveform 5 discussed above provide examples FIGS. 5, 7, and 9 show representations of other exemplary waveforms 500, 700, and 900, respectively, for generating a target. FIGS. 6A-6E, 8A-8E, and 10A-10E show energy of the waveforms 500, 700, and 900 being applied to a target material droplet.

Referring to FIG. 5, a plot of an example waveform 500 that can be used to convert a target material droplet to a target that emits EUV light is shown. FIGS. 6A-6D show the waveform 500 transforming a target material droplet to the target that emits EUV light. The target of the example of FIG. 5 and FIGS. 6A-6D is a flat disk of molten metal that has a pre-plasma formed at a surface that faces an oncoming amplified light beam. The surface can face the oncoming amplified light beam if it is pointed towards the amplified light beam, even if the surface is not transverse to the direction of propagation of the amplified light beam.

The waveform 500 shows a representation of a first pre-pulse 502, a representation of a second pre-pulse 504, and a representation of an amplified light beam 506. In this example, the first pre-pulse 502 has a pulse duration 503 that is 20-70 ns, and an energy of 15-60 mJ. For example, the first pre-pulse 502 can have a wavelength of 1 $\mu$m or 10.6 $\mu$m. In one example, the pulse duration 503 is 40 ns, and the energy is 20 mJ. The second pre-pulse 504 can have a pulse duration 505 that is 1-10 ns, an energy of 1-10 mJ, and a wavelength of 1.06 $\mu$m. In one example, the duration 505 of the second pre-pulse 503 is 10 ns, and the energy of the second pre-pulse is 1 mJ.

The first pre-pulse 502 and the second pre-pulse 504 are separated in time by a delay time 508, with the second pre-pulse 504 occurring after the first pre-pulse 502. The delay time 508 is a time that is long enough to allow a target material droplet that is geometrically altered through an interaction with the first pre-pulse 502 to expand to form the intermediate target 51. The delay time 508 can be 1-3 microseconds ($\mu$s).

The second pre-pulse 504 and the amplified light beam 506 are separated in time by a delay time 509, with the amplified light beam 506 occurring after the second pre-pulse 504. The delay time 509 is long enough to allow the pre-plasma that the second pre-pulse 504 forms at the surface of the disk shaped target to expand. The delay time 509 can be between 10-100 ns or between 1-200 nanoseconds (ns).

FIGS. 6A-6E show side views of a target material supply apparatus that releases target material droplets toward a target location 626 at five different times, $t_1$–$t_5$. The target location 626 is a location in a chamber (such as a chamber 340) that receives the amplified light beam 506 and is at the focus of the collecting optics 346 (FIG. 3A) or the mirror 135 (FIG. 1A). FIG. 6A shows the earliest time, $t_1$, and the time increases from left to right, with FIG. 6E showing the latest time, $t_5$. A target material supply apparatus 620 releases a stream of droplets through a nozzle 624. The stream of droplets includes target material droplets 611 and 610, with the target material droplet 610 being released from the nozzle 624 before the target material droplet 610. FIGS. 6A-6E show the target material droplet 610 being transformed into a target 614 that emits EUV light when struck by the amplified light beam 506.

Referring to FIG. 6A, the target material droplet 610 is struck by the first pre-pulse 502. As shown in FIG. 6B, the impact of the first pre-pulse 502 geometrically deforms and spreads the target material droplet 610 into an elongated segment of target material 612. The elongated segment 612 can have a shape that is disk-like and the elongated segment 612 can be molten target material. The elongated segment of target material 612 expands spatially as it travels toward the target location 626. The elongated segment of target material 612 expands for 1-3 μs (the delay time 508).

Referring to FIG. 6C, at time=$t_3$, which is 1-3 μs after the first pre-pulse 502 strikes the target material droplet 610, the oblong shaped material 612 has expanded into a disk shaped intermediate target 613 as it follows its trajectory toward the target location 626. Referring also to FIG. 6F, the intermediate target 613 has a width 632 and a thickness 630. The thickness 630 of the intermediate target 613 is less than the width. In the example shown in FIGS. 6C and 6F, the width 632 is in the "x" direction and the thickness 630 is in the "y" direction, and the width 632 is along a direction that is transverse to the direction of propagation of the second pre-pulse 504. However, the intermediate target 613 can have other angular placements. For example, as shown in FIG. 6G, the intermediate target 613 can be angled 45° relative to the direction of propagation of the second pre-pulse 504. Even when the intermediate target 613 is angled relative to the path of the second pre-pulse 504, a thickness 631 of the intermediate target 613 measured along the direction of propagation of the pre-pulse 504 is less than the width of the intermediate target 613. As such, an oncoming light beam (such as the second pre-pulse 504) encounters less target area along a direction of propagation than along a plane that is perpendicular to the path that the oncoming light beam would travel if it went directly through the target material droplet 610.

Referring also to FIG. 6D, the interaction between the second pre-pulse 504 and the intermediate target 613 forms a target 614. The interaction creates a pre-plasma 615 that is close to a bulk target material 616. The bulk target material 616 can be target material and can be molten metal. The pre-plasma 615 is allowed to expand over the delay time 509, and the expanded plasma 615 and the bulk target material 616 form the target 614. At time $t_4$, the target 614 arrives at the target location 626.

In greater detail, the second pre-pulse 504 impinges on a surface of the intermediate target 613 and heats the surface to form the pre-plasma 615. Because the intermediate target 613 is shaped like disk with the thin dimension presented to the pre-pulse 504, the pre-plasma 615 can utilize a higher portion of the target material in the bulk material 616. After the pre-plasma has expanded for 1-200 ns the pre-plasma and the bulk target material 616 are collectively called the target 614. The amplified light beam 8 arrives at the target 614 before the pre-plasma 615 blows off or dissipates. For example, the amplified light beam 8 can arrive 10-100 ns or 1-200 ns after the second pre-pulse 504 strikes the intermediate target 613. Because the pre-plasma 615 is present when the amplified light beam 506 arrives, the amplified light beam 506 encounters the pre-plasma 615 prior to reaching the underlying bulk target material 616. Compared to the underlying bulk target material 616, the pre-plasma 615 is less reflective and absorbs the amplified light beam 506 more readily. Thus, the presence of the pre-plasma 615 allows a larger portion of the amplifying light beam 506 to be absorbed.

Further, in the absence of the pre-plasma 615, the amplified light beam 506 impinges on the bulk target material 616 directly. In this instance, the amplified light beam 8 would encounter a metal surface and would mostly be reflected, with a small amount of the amplified light beam 8 being absorbed to ablate the surface of the bulk target material 616 and form a pre-plasma cloud near the surface. The cloud can be formed 5-20 ns after a pulse impinges on the surface. However, many pulses that have energy sufficient to convert the target material to plasma that emits EUV light have a steep leading edge in the first 10-20 ns of the pulse. The amplified light beam 506 has a leading edge 510 (FIG. 5). The intensity of the leading edge 510 (the portion of the pulse that reaches the target surface over the first 10-20 ns of interaction between the pulse and the target) increases rapidly as a function of time, and increases before the cloud of electrons and ions has had a chance to form and before the heating and evaporation process begins. Thus, without the pre-plasma 615, much of the energetic leading edge 510 of the amplified light beam 8 would be reflected and largely unused. However, the pre-plasma 615 absorbs a portion of the energy in the leading edge 510 and converts it to heat that ablates the bulk target material 616.

Referring to FIG. 6E, the amplified light beam 506 converts most or nearly all of the pre-plasma 615 and the bulk target material 616 into EUV light 618.

Referring to FIG. 7, a plot of another exemplary waveform 700 that can be used to convert a target material droplet to a target that emits EUV light is shown. FIGS. 8A-8E show the waveform 700 transforming a target material droplet to the target that emits EUV light. The target of the example of FIG. 7 and FIGS. 8A-8E is a collection of fragmented target material.

The waveform 700 shows a representation of a first pre-pulse 702, a representation of a second pre-pulse 704, and representation of a an amplified light beam 706. The first pre-pulse 702 has a pulse duration 703 that is 20-70 ns, and an energy of 17-60 mJ. The first pre-pulse 702 can have a wavelength of 1 μm or 10.6 μm. In one example, the pulse duration 703 is 40 ns, and the energy is 20 mJ. The second pre-pulse 704 has a pulse duration 705 that is 1-10 ns and an energy of 1-10 mJ. The second pre-pulse 704 has a wavelength of 1.06 μm. In one example, the duration 705 of the second pre-pulse 703 is 10 ns, and the energy of the second pre-pulse is 5 mJ. In another example, the duration 705 of the second pre-pulse 703 is 10 ns, and the energy of the second pre-pulse is 10 mJ.

The first pre-pulse 702 and the second pre-pulse 704 are separated in time by a delay time 708, with the second pre-pulse 704 occurring after the first pre-pulse 702. The delay time 708 is a time that is long enough to allow a target material droplet that is geometrically deformed by the first pre-pulse 702 to expand to form an disk shaped intermediate target. The delay time 708 can be 1-3 microseconds (μs).

The second pre-pulse 704 and the amplified light beam 706 are separated in time by a delay time 709, with the amplified light beam 706 occurring after the second pre-pulse 704. The delay time 709 is long enough to allow the fragments that the second pre-pulse 704 forms to disperse to an optimal distance. The delay time 709 can be 100 nanoseconds (ns) to 1 microsecond (μs).

Referring to FIGS. 8A-8E, five snap shots of the target material supply apparatus 620 are shown, with time increasing from FIG. 8A on the left to FIG. 8E on the right. FIGS. 8A-8C produce the disk-shaped intermediate target 613 as discussed with respect to FIGS. 6A-6C. FIG. 8D shows the generation of the target 814. The target 814 is a collection of pieces or particles of target material that is formed by irradiating the intermediate target 613 with the second pre-pulse 704. The impact of the second pre-pulse 704 breaks the intermediate target 613 into many fragments of target material, each of which is smaller than the intermediate target 613.

Breaking the intermediate target 613 into the fragments provides more target material for the amplified light beam 706 because, collectively, the fragments present more surface area of target material for conversion to plasma. Moreover, because of the thinness of the intermediate target 613, the second pre-pulse 704 may be relatively less energetic and/or longer in duration than a pre-pulse capable of transforming the target material droplet 610 into a collection of fragments.

The target 814 arrives in the target location 626 and receives the amplified light beam. EUV light 818 is produced.

Referring to FIG. 9, a plot of another exemplary waveform 900 that can be used to convert a target material droplet to a target that emits EUV light is shown. FIGS. 10A-10E show the waveform 900 transforming a target material droplet to the target that emits EUV light. The target of the example of FIG. 9 and FIGS. 10A-10E is a pre-plasma that is formed close to a hemisphere shaped target.

The waveform 900 shows a representation of a first pre-pulse 902, a representation of a second pre-pulse 904, and a representation of an amplified light beam 906. The first pre-pulse 902 has a pulse duration 903 that is less than 1 ns. For example, the first pre-pulse 902 can have a wavelength of 1.06 μm, a pulse duration of 300 ps or less, and an energy of 1 mJ-10 mJ. In another example, the first pre-pulse has a duration of 100 ps-300 ps, a wavelength of 1.06 μm, and an energy of 1 mJ-10 mJ. In yet another example, the first pre-pulse 902 has a duration of 150 ps, a wavelength of 1.06 μm, and an energy of 5 mJ.

The second pre-pulse 904 has a pulse duration 905 that is 1-10 ns and an energy of 1-10 mJ. The second pre-pulse 904 has a wavelength of 1.06 μm. In one example, the duration 905 of the second pre-pulse 903 is 10 ns, and the energy of the second pre-pulse is 5 mJ. In another example, the duration 905 of the second pre-pulse 903 is 10 ns, and the energy of the second pre-pulse is 10 mJ.

The first pre-pulse 902 and the second pre-pulse 904 are separated in time by a delay time 908, with the second pre-pulse 904 occurring after the first pre-pulse 902. The delay time 908 is a time that is long enough to allow a target material droplet that is geometrically deformed by the first pre-pulse 902 to expand to form a hemisphere shaped target. For example, the delay time 908 can be about 1000 ns. The delay time 909 is long enough to allow the pre-plasma that the second pre-pulse 904 forms at the surface of the hemisphere shaped target to expand. The delay time 909 can be 10-100 nanoseconds (ns) or 1-200 ns.

Referring to FIGS. 10A-10E, five snap shots of the target material supply apparatus 620 are shown, with time increasing from FIG. 10A on the left to FIG. 10E on the right. The first pre-pulse 902 irradiates the target material droplet 610 to form a hemisphere shaped volume 1012. The hemisphere shaped volume 1012 is a mist or collection of particles 1013 that are distributed throughout a hemisphere shaped space. The particles 1013 are distributed with a density distribution that is minimum at a surface 1002 that faces toward the second pre-pulse 904. The direction of increase of the density distribution contributes to an increased amount of light being absorbed by the volume 1012 because most of the light is absorbed by the volume 1012 before the light reaches a plane of high density that could reflect the light. The hemisphere shaped volume 1012 expands over the delay time 909 to form the hemisphere shaped intermediate target 1014.

The second pre-pulse 904 irradiates the hemisphere shaped intermediate target 1014 to generate a pre-plasma at an edge of the intermediate target 1014 and also converts at least some of the particles 1013 into the pre-plasma. Because the particles 1013 are small, it is relatively easy to generate a pre-plasma from the particles 1013. The pre-plasma expands over the delay time 909 to form the target 1015. The target 1015 includes a hemisphere shaped volume 1017 and a pre-plasma 1016. The amplified light beam 906 irradiates the target 1015 to generate EUV light. The pre-plasma 1016 provides a medium that absorbs the amplified light beam 906 readily, thus, the pre-plasma 1016 can enhance and improve the conversion of the amplified light beam into EUV light.

Other implementations are within the scope of the following claims. For example, the disk shaped intermediate target 613 can have a shape that is similar to a disk or that includes an indentation in one of the surfaces. Any of the waveforms 5, 500, 700, and 900 discussed above can have more than two pre-pulses that interact with target material.

What is claimed is:

1. An extreme ultraviolet light source comprising:
    a solid state laser configured to produce pulses of radiation, the pulses of radiation comprising at least a first pulse of radiation and a second pulse of radiation;
    a second optical source configured to produce a third pulse of radiation, the third pulse of radiation having a different wavelength than the first pulse of radiation and the second pulse of radiation;
    a vacuum chamber configured to receive target material in an interior of the vacuum chamber, the target material comprising a material that emits extreme ultraviolet (EUV) light when converted to plasma; and
    an optical element configured to:
        receive the first pulse of radiation, the second pulse of radiation, and the third pulse of radiation, and
        direct the first pulse of radiation, the second pulse of radiation, and the third pulse of radiation to, respectively, a first location in the interior of the vacuum chamber, a second location in the interior of the vacuum chamber, and a third location in the interior of the vacuum chamber, the first, second, and third locations being different locations in the vacuum chamber and being along a direction that is different than the directions of propagation of the first pulse, the second pulse, and the third pulse of radiation in the vacuum chamber.

2. The extreme ultraviolet light source of claim 1, wherein the solid state laser comprises a neodymium-doped yttrium aluminum garnet (Nd:YAG) laser.

3. The extreme ultraviolet light source of claim 2, wherein the Nd:YAG laser comprises a Q-switched Nd:YAG laser.

4. The extreme ultraviolet light source of claim 1, wherein the solid state laser comprises an Nd:YAG laser, and the second optical source comprises a gas laser, the gas laser comprising a gain medium in a gaseous state.

5. The extreme ultraviolet light source of claim 4, wherein the gain medium of the gas laser comprises carbon dioxide ($CO_2$).

6. The extreme ultraviolet light source of claim 1, wherein the solid state laser comprises an erbium-doped fiber (Er:glass) laser.

7. The extreme ultraviolet light source of claim 1, wherein the pulses of radiation produced by the solid state laser have a wavelength of 1.06 microns (μm).

8. The extreme ultraviolet light source of claim 1, wherein the pulses of radiation produced by the solid state laser have a wavelength of 1.06 microns (μm), and the third pulse of radiation produced by the second optical source has a wavelength of 10.6 μm.

9. The extreme ultraviolet light source of claim 1, wherein the target material comprises a target material droplet, and the ultraviolet light source further comprises a control system comprising machine-executable instructions on a computer-readable medium, the control system configured to cause the solid state laser to:
  emit the first pulse of radiation, the first pulse of radiation comprising an energy sufficient to transform the target material droplet into a geometric distribution of target material that occupies a larger volume than a volume occupied by the target material droplet,
  emit the second pulse of radiation, the second pulse of radiation comprising an energy sufficient to change an absorption characteristic of the geometric distribution to form a modified target that absorbs a greater portion of incident radiation than the target material droplet or the geometric distribution, and the control system is configured to cause the second optical source to:
  emit the third pulse of radiation, the third pulse of radiation comprising an energy sufficient to convert at least some of the modified target into plasma that emits EUV light.

10. The extreme ultraviolet light source of claim 9, further comprising a target material delivery system coupled to the vacuum chamber, the target material delivery system configured to provide the target material droplet to the interior of the vacuum chamber.

11. The extreme ultraviolet light source of claim 10, wherein the target material delivery system releases the target material droplet onto a trajectory in the interior of the vacuum chamber, and the first, second, and third locations are on the trajectory.

12. The extreme ultraviolet light source of claim 10, wherein the target material droplet comprises tin.

13. The extreme ultraviolet light source of claim 1, wherein the optical element comprises a beam splitter.

14. An extreme ultraviolet light source comprising:
  a solid state laser configured to produce pulses of radiation, the pulses of radiation comprising at least a first pulse of radiation and a second pulse of radiation;
  a second optical source configured to produce a third pulse of radiation, the third pulse of radiation having a different wavelength than the first pulse of radiation and the second pulse of radiation;
  a vacuum chamber configured to receive target material in an interior of the vacuum chamber, the target material comprising a target material that emits extreme ultraviolet (EUV) light when converted to plasma; and
  a first optical element configured to:
    receive the pulses of radiation produced by the solid state laser, and
    direct the pulses of radiation toward an interior of the vacuum chamber; and
  a second optical element, separate from the first optical element, the second optical element configured to:
    receive the third pulse of radiation produced by the second optical source, and
    direct the third pulse of radiation toward the interior of the vacuum chamber, wherein the third pulse of radiation is directed to a different location in the vacuum chamber than the pulses produced by the solid state laser.

15. The extreme ultraviolet light source of claim 14, wherein the first optical element comprises at least one optical fiber, and the second optical element comprises a surface that is optically reflective at the wavelength of the third pulse of radiation, the surface being positioned to direct the third pulse of radiation into the interior of the vacuum chamber.

16. The extreme ultraviolet light source of claim 14, wherein the solid state laser comprises an Nd:YAG laser.

17. The extreme ultraviolet light source of claim 14, wherein the solid state laser comprises an Nd:YAG laser, and the second optical source comprises a gas laser, the gas laser comprising a gain medium in a gaseous state.

18. The extreme ultraviolet light source of claim 14, wherein:
  the target material comprises a target material droplet;
  the ultraviolet light source further comprises a control system comprising machine-executable instructions on a computer-readable medium;
  the control system is configured to cause the solid state laser to:
    emit the first pulse of radiation, the first pulse of radiation comprising an energy sufficient to transform the target material droplet into a geometric distribution of target material that occupies a larger volume than a volume occupied by the target material droplet,
    emit the second pulse of radiation, the second pulse of radiation comprising an energy sufficient to change an absorption characteristic of the geometric distribution to form a modified target that absorbs a greater portion of incident radiation than the target material droplet or the geometric distribution; and
  the control system is configured to cause the second optical source to:
    emit the third pulse of radiation, the third pulse of radiation comprising an energy sufficient to convert at least some of the modified target into plasma that emits EUV light.

19. The extreme ultraviolet light source of claim 18, wherein the target material droplet comprises tin.

20. A photolithography system comprising:
  a lithography tool configured to process wafers; and
  an extreme ultraviolet light source comprising:
    a solid state laser configured to produce pulses of radiation, the pulses of radiation comprising at least a first pulse of radiation and a second pulse of radiation;
    a second optical source configured to produce a third pulse of radiation, the third pulse of radiation having a different wavelength than the first pulse of radiation and the second pulse of radiation;
    a vacuum chamber configured to receive target material in an interior of the vacuum chamber, the target material comprising a target material that emits extreme ultraviolet (EUV) light when converted to plasma;
    an EUV collecting optic in the vacuum chamber configured to direct EUV light emitted by the plasma to the lithography tool; and
    an optical element configured to:
      receive the first pulse of radiation, the second pulse of radiation, and the third pulse of radiation, and
      direct the first pulse of radiation, the second pulse of radiation, and the third pulse of radiation beam to, respectively, a first location in the interior of the vacuum chamber, a second location in the interior of the vacuum chamber, and a third location in the interior of the vacuum chamber, the first, second, and third locations being different locations in the vacuum chamber and being located along a direction that is different than a direction of propagation of the first pulse, the second pulse, and the third pulse of radiation in the vacuum chamber.

\* \* \* \* \*